United States Patent
Schildknecht et al.

(10) Patent No.: US 8,241,764 B2
(45) Date of Patent: Aug. 14, 2012

(54) OLED DISPLAY WITH EXTENDED LIFETIME

(75) Inventors: Christian Schildknecht, Mannheim (DE); Evelyn Fuchs, Mannheim (DE); Nicolle Langer, Heppenheim (DE); Klaus Kahle, Ludwigshafen (DE); Christian Lennartz, Schifferstadt (DE); Oliver Molt, Hirschberg (DE); Gerhard Wagenblast, Wachenheim (DE); Jens Rudolph, Worms (DE)

(73) Assignee: BASF Aktiengesellschaft, Ludwigshafen (DE)

( * ) Notice: Subject to any disclaimer, the term of this patent is extended or adjusted under 35 U.S.C. 154(b) by 598 days.

(21) Appl. No.: 12/441,909

(22) PCT Filed: Sep. 13, 2007

(86) PCT No.: PCT/EP2007/059648
§ 371 (c)(1),
(2), (4) Date: Mar. 19, 2009

(87) PCT Pub. No.: WO2008/034758
PCT Pub. Date: Mar. 27, 2008

(65) Prior Publication Data
US 2009/0278119 A1    Nov. 12, 2009

(30) Foreign Application Priority Data

Sep. 21, 2006  (EP) ...................................... 06121077
Jul. 5, 2007   (EP) ...................................... 07111816

(51) Int. Cl.
*H01L 51/54* (2006.01)
(52) U.S. Cl. ......... 428/690; 428/917; 313/504; 313/506
(58) Field of Classification Search ........................ None
See application file for complete search history.

(56) References Cited

U.S. PATENT DOCUMENTS

| | | | |
|---|---|---|---|
| 5,668,438 A | 9/1997 | Shi et al. | |
| 2005/0260447 A1 | 11/2005 | Brooks et al. | |
| 2005/0260448 A1 | 11/2005 | Lin et al. | |
| 2006/0051615 A1 | 3/2006 | Kanno et al. | |
| 2006/0255332 A1 | 11/2006 | Becker et al. | |
| 2006/0258043 A1 | 11/2006 | Bold et al. | |
| 2007/0075631 A1* | 4/2007 | Tung et al. | 313/504 |
| 2007/0224446 A1* | 9/2007 | Nakano et al. | 428/690 |
| 2007/0262703 A1* | 11/2007 | Tsai et al. | 313/503 |
| 2010/0219403 A1* | 9/2010 | Langer et al. | 257/40 |

FOREIGN PATENT DOCUMENTS

| | | |
|---|---|---|
| DE | 103 55 380 | 6/2005 |
| WO | 2005 019373 | 3/2005 |
| WO | 2005 113704 | 12/2005 |

OTHER PUBLICATIONS

Peter Erk, et al., "Efficient Deep Blue Triplet Emitters for OLEDs", International Symposium, Soicety for Information Display, LO, vol. XXXVII, pp. 131-133, XP007012644, 2006.
Kenichi Goushi, et al., "Triplet excition confinement and unconfinement by adjacent hole-transport layers" American Institute of Physics, vol. 95, No. 12, pp. 7798-7802, XP012067136, 2004.
Ming-Han Tsai, et al. "Highly Efficient Organic Blue Electrophosophorescent Devices Based on 3,6 Bis (triphenylsilyl)carbazole as the Host Material" Advanced Materials, vol. 18, pp. 1216-1220, XP002483366, 2006.
U.S. Appl. No. 12/667,765, filed Jan. 5, 2010, Langer, et al.
U.S. Appl. No. 12/667,619, filed Jan. 4, 2010, Langer, et al.
U.S. Appl. No. 12/597,651, filed Oct. 26, 2009, Moonen, et al.

\* cited by examiner

*Primary Examiner* — Dawn L. Garrett
(74) *Attorney, Agent, or Firm* — Oblon, Spivak, McClelland, Maier & Neustadt, L.L.P.

(57) ABSTRACT

The present invention relates to an organic light-emitting diode which has a light-emitting layer C which comprises at least one hole-conducting material CA and at least one phosphorescence emitter CB, to mixtures comprising at least one carbene complex in combination with at least one hole-conducting material or in combination with at least one phosphorescence emitter, and to the use of mixtures comprising at least one hole-conducting material and at least one phosphorescence emitter as a light-emitting layer in OLEDs for prolonging the lifetime of the light-emitting layer. The inventive organic light-emitting diode may have, in at least one of the layers of the organic light emitting diode, preferably in the hole-blocking layer and/or the electron-blocking layer and/or the light-emitting layer C, in addition to the hole-conducting material CA and the emitter CB, at least one compound selected from disilylcarbazoles, disilyldibenzofurans, disilyldibenzothiophenes, disilyldibenzophospholes, disilyldibenzothiophene S-oxides and disilyldibenzothiophene S,S-dioxides.

8 Claims, No Drawings

OLED DISPLAY WITH EXTENDED LIFETIME

The present invention relates to an organic light-emitting diode which has a light-emitting layer C which comprises at least one hole-conducting material CA and at least one phosphorescence emitter CB, to mixtures comprising at least one carbene complex in combination with at least one hole-conducting material or in combination with at least one phosphorescence emitter, and to the use of mixtures comprising at least one hole-conducting material and at least one phosphorescence emitter as a light-emitting layer in OLEDs for prolonging the lifetime of the light-emitting layer. The inventive organic light-emitting diode may have, in at least one of the layers of the organic light-emitting diode, preferably in the hole-blocking layer and/or the electron-blocking layer and/or the light-emitting layer C, in addition to the hole-conducting material CA and the emitter CB, at least one compound selected from disilylcarbazoles, disilyldibenzofurans, disilyldibenzothiophenes, disilyldibenzophospholes, disilyldibenzothiophene S-oxides and disilyldibenzothiophene S,S-dioxides.

Organic light-emitting diodes (OLEDs) utilize the property of materials of emitting light when they are excited by electrical current. OLEDs are of particular interest as an alternative to cathode ray tubes and liquid-crystal displays for the production of flat visual display units. Owing to the very compact design and the intrinsically low power consumption, devices comprising OLEDs are suitable especially for mobile applications, for example for uses in cellphones, laptops, etc.

The basic principles of the way in which OLEDs function and suitable constructions (layers) of OLEDs are known to those skilled in the art and are specified, for example, in WO 2005/113704 and the literature cited therein. The light-emitting materials used (emitters) may, as well as fluorescent materials (fluorescence emitters), be phosphorescent materials (phosphorescence emitters). The phosphorescence emitters are typically organometallic complexes which, in contrast to the fluorescence emitters which exhibit singlet emission, exhibit triplet emission (M. A. Baldow et al., Appl. Phys. Lett. 1999, 75, 4 to 6). For quantum-mechanical reasons, when the phosphorescence emitters are used, up to four times the quantum efficiency, energy efficiency and power efficiency are possible. In order to implement the advantages of the use of the organometallic phosphorescence emitters in practice, it is necessary to provide phosphorescence emitters and device compositions which have a long operative lifetime, a high stability toward thermal stress and a low use voltage and operating voltage.

In order to satisfy the aforementioned requirements, numerous phosphorescence emitters and device compositions have been proposed in the prior art.

For instance, WO 2005/019373 relates to the first use of uncharged transition metal complexes which comprise at least one carbene ligand in OLEDs. According to WO 2005/019373, these transition metal complexes can be used in any layer of an OLED, and the ligand structure or central metal can be varied for adjustment to desired properties of the transition metal complexes. For example, it is possible to use the transition metal complexes in a blocking layer for electrons, a blocking layer for excitons, a blocking layer for holes or the light-emitting layer of the OLED, preference being given to using the transition metal complexes as emitter molecules in OLEDs.

WO 2005/113704 relates to luminescent compounds which bear carbene ligands. WO 2005/113704 specifies numerous transition metal complexes with various carbene ligands, preference being given to using the transition metal complexes as phosphorescent light-emitting material, more preferably as a dopant substance.

U.S. Pat. No. 5,668,438 discloses an organic light-emitting diode formed from a cathode, an electron transport layer, a hole transport layer and an anode, the electron transport layer and the hole transport layer being selected so as to ensure that the light emission proceeds in the hole transport layer of the organic light-emitting diode. In one embodiment in U.S. Pat. No. 5,668,438, the hole transport layer is doped with a fluorescent material. The use of phosphorescent materials is not mentioned in U.S. Pat. No. 5,668,438. The organic light-emitting diode according to U.S. Pat. No. 5,668,438 is notable in particular for an improved efficiency over customary organic light-emitting diodes. U.S. Pat. No. 5,668,438 mentions, by way of example, the use of a green-fluorescing hole transport material having a typical band gap of 2.50 eV, which is used together with a blue-fluorescing electron transport material having a typical band gap of 2.75 eV.

DE-A 103 55 380 relates to material mixtures comprising at least one matrix material which has a certain structural unit L=X and/or M=X, where the X radical has at least one non-bonding electron pair, the L radical is P, As, Sb or Bi, the M radical is S, Se or Te, and at least one emission material which is capable of emission and is a compound which emits light in the event of suitable excitation and comprises at least one element of atomic number >20. The mixtures can be used in electronic components, especially in OLEDs, and lead, according to DE-A 103 55 380, to an improvement in relation to the efficiency in combination with a greatly increased lifetime. It is pointed out that the mixtures according to DE-A 103 55 380 make possible a significantly simplified layer structure of the OLED, since neither a separate hole-blocking layer nor a separate electron transport layer and/or electron injection layer need be used. According to the examples, an OLED with bis(9,9'-spirobifluoren-2-yl)phenylphosphine oxide as the host material, which has been doped with Ir(PPy)$_3$ as an emitter, is used, and the OLED exhibits green emission.

There is still a need for organic light-emitting diodes which feature not only good efficiency and a low use voltage and operating voltage, but also a particularly long operative lifetime. In particular, the need for OLEDs which emit blue light is very high.

It is therefore an object of the present invention to provide organic light-emitting diodes (OLEDs) and materials which can be used in the emitter layer in organic light-emitting diodes, which feature in particular a long operative lifetime and preferably emit light in the blue region of the electromagnetic spectrum.

This object is achieved by an organic light-emitting diode (OLED) comprising
 i) an anode A;
 ii) a hole-conducting layer, formed from at least one hole-conducting material, B;
 iii) a light-emitting layer C;
 iv) an electron-conducting layer D;
 v) a cathode E;
where the layers A, B, C, D and E are arranged in the aforementioned sequence and one or more further layers may be applied between layers A and B, B and C, C and D and/or D and E.

In the inventive organic light-emitting diode (OLED), the light-emitting layer comprises at least one hole-conducting material CA and at least one phosphorescence emitter CB.

It has been found that, surprisingly, the lifetime of the light-emitting layer of an OLED comprising at least one hole-conducting material CA together with at least one phosphorescence emitter CB can be prolonged by up to 100 times compared to a light-emitting layer which does not comprise a hole-conducting material.

Anode A

The anode materials used for the anode A may be all anode materials known to those skilled in the art. Suitable materials for the anode are, for example, materials which comprise a metal, a mixture of different metals, a metal alloy, a metal oxide or a mixture of different metal oxides. Alternatively, the anode may be a conducting polymer. Suitable metals are, for example, metals of groups IB, IIB, IVB, VB, VIB, VIII, IVA and IVB of the Periodic Table of the Elements (CAS version). When the anode should be transparent, mixed metal oxides of groups IIB, IIIA and IVA of the Periodic Table of the Elements (CAS version) are generally used, especially indium tin oxide (ITO), which is particularly preferred. It is likewise possible that the anode A comprises an organic material, for example polyaniline, as described, for example, in Nature, vol. 357, page 477 to 479 (Jun. 11, 1992). At least either the anode or the cathode should be at least partly transparent in order to be able to emit the light formed in the light-emitting layer.

Hole-Conducting Layer B and Light-Emitting Layer C

Hole-Conducting Materials B and CA

The hole-conducting layer B is formed from at least one hole-conducting material. According to the invention, the light-emitting layer C comprises, as well as at least one phosphorescence emitter CB, likewise at least one hole-conducting material CA. The hole-conducting materials in the light-emitting layer C and the hole-conducting layer B may be the same or different.

The HOMO of the at least one hole-conducting material of the hole-conducting layer B and the HOMO of the at least one hole-conducting material CA of the light-emitting layer C preferably have a separation from the work function of the anode of $\leqq 1$ eV, preferably in the region of about $\leqq 0.5$ eV. When, for example, the anode material used is ITO, whose work function is about 5 eV, the hole-conducting material used in layer B and the hole-conducting material CA used in layer C are preferably a material whose HOMO is $\leqq 6$ eV, preferably in the range from 5 to 6 eV.

The hole-conducting materials used in layers C and B may be all suitable hole-conducting materials known to those skilled in the art. The band gap of the at least one hole-conducting material, both of the hole-conducting layer B and of the light-emitting layer C, is preferably greater than the band gap of the at least one phosphorescence emitter CB used in the light-emitting layer C. In a further embodiment of the present invention, it is likewise possible that the band gap of the hole-conducting layer B is equal to or smaller than the band gap of the at least one phosphorescence emitter CB used in the light-emitting layer C.

In the context of the present application, band gap is understood to mean the triplet energy.

Typical hole-conducting materials are disclosed, for example, in Kirk-Othmer, Encyclopedia of Chemical Technology, 4th ed., vol. 18, pages 837 to 860, 1996. Both hole-transporting molecules and polymers can be used as hole-conducting materials. Hole-conducting materials which are typically used are selected from the group consisting of 4,4'-bis[N-(1-naphthyl)-N-phenylamino]biphenyl (α-NPD), N,N'-diphenyl-N,N'-bis(3-methylphenyl)-[1,1'-biphenyl]-4,4'-diamine (TPD), 1,1-bis[(di-4-tolylamino)-(3,3'-dimethyl) biphenyl]-4,4'-diamine (ETPD), tetrakis(3-methylphenyl)-N,N,N',N'-2,5-phenylenediamine (PDA), α-phenyl-N,N-diphenylaminostyrene (TPF), p-(diethylamino)-benzaldehyde diphenylhydrazone (DEH), triphenylamine (TPA), bis[4-(N,N-di-ethylamino)-2-methylphenyl](4-methylphenyl)methane (MPMP), 1-phenyl-3-[p-(diethyl-amino) styryl]-5-[p-(diethylaminophenyl)]pyrazoline (PPR or DEASP), 1,2-trans-bis(9H-carbazol-9-yl)cyclobutane (DCZB), N,N,N',N'-tetrakis(4-methylphenyl)-(1,1'-biphenyl)-4,4'-diamine (TTB), 4,4',4"-tris(N,N-diphenylamino) triphenylamine (TDTA) and porphyrin compounds, and also phthalocyanines such as copper phthalocyanines. Hole-transporting polymers which are typically used are selected from the group consisting of polyvinylcarbazoles, (phenylmethyl) polysilanes, PEDOT (poly(3,4-ethylenedioxythiophene)), preferably PEDOT doped with PSS (polystyrenesulfonate), and polyanilines. It is likewise possible to obtain hole-transporting polymers by doping hole-transporting molecules into polymers such as polystyrene and polycarbonate. Suitable hole-transporting molecules are the molecules already mentioned above.

As already mentioned above, the band gap of the at least one hole-conducting material of layer B and of the at least one hole-conducting material CA of layer C is preferably greater than the band gap of the at least one phosphorescence emitter CB. In a further embodiment of the present invention, it is likewise possible that the band gap of the hole-conducting layer B is equal to or smaller than the band gap of the at least one phosphorescence emitter CB used in the light-emitting layer C.

In addition to the aforementioned customary hole-conducting materials, suitable hole-conducting materials for layer B and for layer C are additionally, for example, transition metal complexes, and materials which are used customarily as emitter materials are also suitable. For example, phosphorescence emitters can be used as hole-conducting materials in layers B and C when they have a band gap which is larger than the band gap of the phosphorescence emitter CB used in layer C. Suitable hole-conducting materials which belong to the aforementioned group of materials are, for example, the transition metal complexes mentioned below as phosphorescence emitters, provided that they fulfill the aforementioned condition in relation to the phosphorescence emitter used.

Furthermore, in addition to the aforementioned hole-conducting materials, in a further embodiment of the present invention, disilylcarbazoles and disilylbenzophospholes of the general formula (III) mentioned below ($X=NR^{37}$ or $PR^{37}$) are suitable as hole-conducting materials for the layer B or as component CA in the light-emitting layer C.

The band gaps mentioned in the present application and the energies of the HOMOs and LUMOs of the materials used in the inventive OLED can be determined by different methods, for example by solution electrochemistry, for example cyclic voltammetry, or by ultraviolet photon electron spectroscopy (UPS). It is also possible to calculate the position of the LUMO of a particular material from the electrochemically determined HOMO and the band separation determined optically by absorption spectroscopy. The data cited in the present application regarding the position of the HOMOs and LUMOs, and the band separation of the materials used in the inventive OLED, are determined by means of UPS on the pure compounds in the form of their solids. UPS is a process known to those skilled in the art, and the determination of the position of the HOMOs and LUMOs and of the band gap on the basis of the results of the UPS are known to those skilled in the art.

Phosphorescence Emitter CB

Suitable phosphorescence emitters CB in the light-emitting layer are in principle all phosphorescence emitters known to those skilled in the art. According to the present invention, preference is given to using, in the light-emitting layer C, phosphorescence emitters CB which have a band gap of ≧2.5 eV, preferably from 2.5 eV to 3.4 eV, more preferably from 2.6 eV to 3.2 eV, most preferably from 2.8 eV to 3.2 eV. Very particular preference is thus given to phosphorescence emitters which emit blue light. As already mentioned above, the band gap of the hole-conducting material used in layers B and C is preferably larger than the band gap of the phosphorescence emitter. The above value of the band gap of the phosphorescence emitter can be used to determine the band gap of the hole-conducting material of layer B and of layer C suitable with preference in a simple manner.

In the inventive OLED, preference is given to using a phosphorescence emitter CB which has at least one element selected from groups IB, IIB, IIIB, IVB, VB, VIIB, VIIB, VIIIB, the lanthanides and IIIA of the Periodic Table of the Elements (CAS version). The phosphorescence emitter preferably has at least one element selected from groups IIB, IIIB, IVB, VB, VIIB, VIIB, VIII of the Periodic Table of the Elements (CAS version), Cu and Eu. Even more preferably, the phosphorescence emitter has at least one element selected from groups IB, VIIB, VIIB, VIII and Eu, the at least one element preferably being selected from Cr, Mo, W, Mn, Tc, Re, Ru, Os, Co, Rh, Ir, Fe, Nb, Pd, Pt, Cu, Ag, Au and Eu; the at least one element is even more preferably selected from Os, Rh, Ir, Ru, Pd and Pt, and even more especially preferably from Ru, Rh, Ir and Pt. In a further very especially preferred embodiment, the phosphorescence emitter has at least one element selected from Ir and Pt.

In a very particularly preferred embodiment, the at least one hole-conducting material CA in the layer C and/or the phosphorescence emitter CB is a carbene complex. The hole-conducting material of the hole-conducting layer B may likewise be a carbene complex. Preference is given to carbene complexes which have at least one of the aforementioned elements. When carbene complexes are used both as hole-conducting materials and as phosphorescence emitters, the carbene complexes used are different carbene complexes, the band gap of the carbene complex used as the hole-conducting material being greater than the band gap of the carbene complex used as the phosphorescence emitter. The carbene complexes used as the hole-conducting material CA in the light-emitting layer and the carbene complexes used as the hole-conducting material in the hole-conducting layer B may be the same or different.

The carbene complex used with preference as the phosphorescence emitter in the light-emitting layer has, in a preferred embodiment, a band gap of ≧2.5 eV, preferably from 2.5 eV to 3.4 eV, more preferably from 2.6 eV to 3.2 eV, most preferably from 2.8 eV to 3.2 eV. Especially preferably, the carbene complex used as the phosphorescence emitter CB is a blue light-emitting compound.

Carbene complexes used with preference as the phosphorescence emitter CB in the light-emitting layer C or as the hole-conducting material CA in the layer C or as the hole-conducting material in the layer B have the general formula I:

(I)

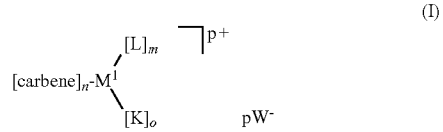

in which the symbols are each defined as follows:
$M^1$ is a metal atom selected from the group consisting of transition metals of groups IB, IIB, IIIB, IVB, VB, VIIB, VIIB, VIII, the lanthanides and IIIA of the Periodic Table of the Elements (CAS version) in any oxidation state possible for the particular metal atom; where preferred metal atoms are the metal atoms already mentioned above for the phosphorescence emitter CB;

carbene is a carbene ligand which may be uncharged or monoanionic and mono-, bi- or tridentate; the carbene ligand may also be a bis- or triscarbene ligand;

L is a mono- or dianionic ligand, preferably monoanionic ligand, which may be mono- or bidentate;

K is an uncharged mono- or bidentate ligand;

n is the number of carbene ligands, where n is at least 1, preferably from 1 to 6, and the carbene ligands in the complex of the formula I when n>1 may be the same or different;

m is the number of ligands L, where m may be 0 or ≧1, preferably from 0 to 5, and the ligands L when m>1 may be the same or different;

o is the number of ligands K, where o may be 0 or ≧1, preferably from 0 to 5, and the ligands K when o>1 may be the same or different;

p is the charge of the complex: 0, 1, 2, 3 or 4;

$W^-$ is a monoanionic counterion;

where the sum of n+m+o and the charge p depends on the oxidation state and coordination number of the metal atom used, the charge of the complex and on the denticity of the carbene, L and K ligands, and on the charge of the carbene and L ligands, with the condition that n is at least 1.

In a particularly preferred embodiment of the present invention, the phosphorescence emitter CB, the hole-conducting material used in the hole-conducting layer B and the hole-conducting material CA used in the light-emitting layer C are each a carbene complex of the general formula I, the band gap of the hole-conducting material used in the layer B and in the layer C being larger than the band gap of the phosphorescence emitter CB.

Suitable carbene complexes of the formula I used with preference are specified in WO 2005/019373, WO 2005/113704, WO 06/018292, WO 06/056418 and European applications 06112198.4, 06112228.9, 06116100.6 and 06116093.3, which have an earlier priority date but had not been published at the priority date of the present application. Particularly preferred carbene complexes are specified in WO 05/019373 and WO 06/056148. The carbene complexes mentioned in the above documents can be used either as the hole-conducting material in the hole-conducting layer B or hole-conducting material CA in the layer C and/or as the phosphorescence emitter CB in the light-emitting layer C. The hole-conducting materials which can be used in layer B or in layer C may be carbene complexes other than the materials used as the phosphorescence emitter in the light-emitting layer C. The carbene complexes used as hole-conducting materials preferably have a larger band gap than the carbene complexes used as the phosphorescence emitter CB, as has already been mentioned above. Suitable band gaps for carbene complexes used with preference have likewise already been mentioned above.

Depending on the coordination number of the metal $M^1$ used in the carbene complexes of the formula I and the nature and the number of the L, K and carbene ligands used, different isomers of the corresponding metal complexes may be present with the same metal $M^1$ and the same nature and number of the K, L and carbene ligands used. For example, in the case of complexes with a metal $M^1$ of coordination number 6 (i.e. octahedral complexes), for example Ir(III) complexes, both cis/trans isomers, when the complexes are of the general composition $MA_2B_4$, and fac-mer isomers (facial/ meridional isomers), when the complexes are of the general composition $MA_3B_3$, are possible. In square-planar complexes with a metal $M^1$ of coordination number 4, for example Pt(II) complexes, cis/trans isomers are possible when the complexes are of the general composition $MA_2B_2$. The symbols A and B are each one binding site of a ligand, and not only monodentate but also bidentate ligands may be present. An unsymmetrical bidentate ligand has an A group and a B group according to the aforementioned general composition.

Those skilled in the art know what is meant by cis/trans and fac-mer isomers. Further remarks regarding cis/trans and fac-mer isomerism can be taken, for example, from WO 05/019373.

In general, the different isomers of the metal complexes of the formula I can be separated by processes known to those skilled in the art, for example by chromatography, sublimation or crystallization.

More preferably, the carbene complexes of the general formula I have a metal atom $M^1$ selected from the group consisting of Ir, Os, Rh and Pt, preference being given to Os(II), Rh(III), Ir(I), Ir(III) and Pt(II). Particular preference is given to using Ir, preferably Ir(III).

Suitable mono- or dianionic ligands L, preferably monoanionic ligands L, which may be mono- or bidentate are the ligands used customarily as mono- or bidentate, mono- or dianionic ligands.

The ligands L used are typically non-photoactive ligands. Suitable ligands are, for example, monoanionic monodentate ligands such as halides, especially $Cl^-$, $Br^-$, $I^-$, pseudohalides, especially $CN^-$, $OAc^-$, alkyl radicals which are bonded to the transition metal atom $M^1$ via a sigma bond, for example $CH_3$, alkoxides, thiolates, amides. Suitable monoanionic bidentate ligands are, for example, acetylacetonate and its derivatives, and also the monoanionic bidentate ligands and oxide mentioned in WO 02/15645.

Suitable uncharged mono- or bidentate ligands K are those ligands which are used customarily as uncharged mono- or bidentate ligands. In general, the ligands K used in the transition metal-carbene complexes of the formula I are non-photoactive ligands. Suitable ligands K are, for example, phosphines, especially trialkylphosphines, e.g. $PEt_3$, $PnBu_3$, triarylphosphines, e.g. $PPh_3$; phosphonates and derivatives thereof, arsenates and derivatives thereof, phosphites, CO, nitriles, amines, dienes which can form a π-complex with $M^1$, for example 2,4-hexadiene, $\eta^4$-cyclooctadiene and $\eta^2$-cyclooctadiene (in each case 1,3 and 1,5), allyl, methallyl, cyclooctene and norbornadiene. In addition, suitable uncharged bidentate ligands K are heterocyclic noncarbene ligands, as disclosed in European application 06112198.4.

Suitable monoanionic counterions $W^-$ are, for example, halide, pseudohalide, $BF_4^-$, $PF_6^-$, $AsF_6^-$, $SbF_6^-$ or $OAc^-$, preferably $Cl^-$, $Br^-$, $I^-$, $CN^-$, $OAc^-$, more preferably $Br^-$ or $I^-$.

The number n of carbene ligands in the transition metal-carbene complexes of the formula I is at least 1, preferably from 1 to 6. The number n is based on the number of bonds of carbene carbon atoms to the transition metal $M^1$. This means that, for a bridged carbene ligand which has, for example, two carbene carbon atoms which can form a bond to the transition metal $M^1$, n=2. When bidentate carbene ligands are used, where the bond to $M^1$ is via a carbene carbon atom and a noncarbene carbon atom, n=1. Such carbene complexes are preferred and are described in detail below. When bidentate carbene complexes are used, where one bond to $M^1$ is via a carbene carbon atom and the second bond to $M^1$ is via a noncarbene carbon atom, n is preferably from 1 to 3, more preferably 2 or 3, most preferably 3.

The number m of monoanionic ligands L in the transition metal-carbene complexes of the formula I is from 0 to 5, preferably from 0 to 2. When m is >1, the ligands L may be the same or different, preferably the same.

The number o of uncharged ligands K in the transition metal-carbene complexes of the formula I is from 0 to 5, preferably from 0 to 3. When o is >1, the ligands K may be the same or different, preferably the same.

The number p specifies the charge of the transition metal complex, which may be uncharged (p=0) or positively charged, p=1, 2, 3 or 4, preferably 1, 2, 3, more preferably 1 or 2. More preferably, p is 0, 1 or 2; most preferably, p is 0. At the same time, the number p specifies the number of monoanionic counterions $W^-$.

When the transition metal-carbene complex of the formula I is an uncharged metal-carbene complex, p=0. When the transition metal-carbene complex is positively charged, the number p of monoanionic counterions corresponds to the positive charge of the transition metal-carbene complex.

The number of carbene, K and L ligands and the number of monoanionic counterions $W^-$, i.e. n, o, m and p, are dependent upon the oxidation state and the coordination number of the metal atom $M^1$ used, and upon the charge of the ligands and the total charge of the complex.

The "carbene" ligand may in principle be any suitable carbene ligand, preference being given to the carbene ligands disclosed in the aforementioned documents. The carbene ligand more preferably has the general formula II:

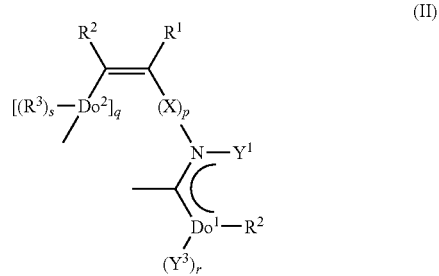

(II)

where the symbols in the carbene ligands of the general formula II are each defined as follows:

$Do^1$ is a donor atom selected from the group consisting of C, P, N, O, S and Si, preferably P, N, O and S;

$Do^2$ is a donor atom selected from the group consisting of C, N, P, O and S;

r is 2 when $Do^1$ is C or Si, is 1 when $Do^1$ is N or P, and is 0 when $Do^1$ is O or S;

s is 2 when $Do^2$ is C, is 1 when $Do^2$ is N or P, and is 0 when $Do^2$ is O or S;

X is a spacer selected from the group consisting of silylene, alkylene, arylene, heteroarylene, alkynylene, alkenylene, $NR^{13}$, $PR^{14}$, $BR^{15}$, O, S, SO, $SO_2$, CO, CO—O, O—CO and $(CR^{16}R^{17})_w$, where one or more nonadjacent $(CR^{16}R^{17})$ groups may be replaced by $NR^{13}$, $PR^{14}$, $BR^{15}$, O, S, SO, $SO_2$, CO, CO—O, O—CO;

w is from 2 to 10;

$R^{13}$, $R^{14}$, $R^{15}$, $R^{16}$, $R^{17}$ are each H, alkyl, aryl, heteroaryl, alkenyl, alkynyl;

p is 0 or 1;

q is 0 or 1;

$Y^1$, $Y^2$ are each independently hydrogen or a carbon group selected from the group consisting of alkyl, aryl, heteroaryl, alkynyl and alkenyl groups; or $Y^1$ and $Y^2$ together form a bridge between the donor atom $Do^1$ and the nitrogen atom N, said bridge having at least two atoms of which at least one is a carbon atom;

$R^1$, $R^2$ are each independently hydrogen, alkyl, aryl, heteroaryl, alkynyl or alkenyl radicals, or $R^1$ and $R^2$ together form a bridge having a total of from 3 to 5 atoms, of which from 1 to 5 atoms may be heteroatoms and the remaining atoms are carbon atoms, such that the group

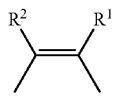

forms a five- to seven-membered ring which, if appropriate—in addition to the double bond already present—may have one further double bond or—in the case of a six- or seven-membered ring—two further double bonds, and may optionally be substituted by alkyl or aryl groups and/or groups with donor or acceptor action, and may optionally comprise at least one heteroatom, and the five- to seven-membered ring may optionally be fused to one or more further rings;

in addition, $Y^1$ and $R^1$ may be bonded to one another via a bridge, where the bridge may be defined as follows:

alkylene, arylene, heteroarylene, alkynylene, alkenylene, $NR^{18}$, $PR^{19}$, $BR^{20}$, O, S, SO, $SO_2$, $SiR^{30}R^{31}$, CO, CO—O, O—CO and $(CR^{21}R^{22})_x$, where one or more nonadjacent $(CR^{21}R^{22})$ groups may be replaced by $NR^{18}$, $PR^{19}$, $BR^{20}$, O, S, SO, $SO_2$, $SiR^{30}R^{31}$, CO, CO—O, O—CO, where x is from 2 to 10; and $R^{18}$, $R^{19}$, $R^{20}$, $R^{21}$, $R^{22}$, $R^{30}$, $R^{31}$ are each H, alkyl, aryl, heteroaryl, alkenyl, alkynyl;

$R^3$ is hydrogen, an alkyl, aryl, heteroaryl, alkynyl or alkenyl radical;

$Y^3$ is hydrogen, an alkyl, alkynyl or alkenyl radical, or

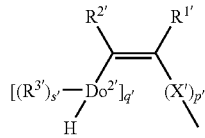

where $Do^{2'}$, $q'$, $s'$, $R^{3'}$, $R^{1'}$, $R^{2'}$, $X'$ and $p'$ are each independently as defined for $Do^2$, q, s, $R^3$, $R^1$, $R^2$, X and p;

in addition, $Y^2$ and $Y^3$ in each of the n carbene ligands may be bonded to one another via a bridge, where the bridge may be defined as follows:

alkylene, arylene, heteroarylene, alkynylene, alkenylene, $NR^{25}$, $PR^{26}$, $BR^{27}$, O, S, SO, $SO_2$, $SiR^{32}R^{33}$, CO, CO-0, O—CO and $(CR^{28}R^{29})_y$, where one or more nonadjacent $(CR^{28}R^{29})$ groups may be replaced by $NR^{25}$, $PR^{26}$, $BR^{27}$, O, S, SO, $SO_2$, $SiR^{32}R^{33}$, CO, CO—O, O—CO, where y is from 2 to 10;

and $R^{25}$, $R^{26}$, $R^{27}$, $R^{28}$, $R^{29}$, $R^{32}$, $R^{33}$ are each H, alkyl, aryl, heteroaryl, alkynyl, alkenyl.

The terms aryl radical or group, heteroaryl radical or group, alkyl radical or group, alkenyl radical or group, and alkynyl radical or group, and also groups or substituents with donor or acceptor action, each have the definitions detailed in European application 06112198.4.

The terms aryl radical or group, heteroaryl radical or group, alkyl radical or group, and groups or substituents with donor or acceptor action, are preferably each defined as follows:

The alkyl radicals and the alkyl radicals of the alkoxy groups according to the present invention may be either straight-chain or branched or cyclic, and/or are optionally substituted by substituents selected from the group consisting of aryl, alkoxy and halogen. Suitable aryl substituents are specified below. Examples of suitable alkyl groups are $C_1$-$C_{20}$-alkyl, preferably $C_1$-$C_{10}$-alkyl, more preferably methyl, ethyl, propyl, butyl, pentyl, hexyl, heptyl and octyl, and also derivatives of the alkyl groups mentioned substituted by aryl, alkoxy and/or halogen, especially F, for example $CF_3$. Also included are both the n-isomers of the radicals mentioned and branched isomers such as isopropyl, isobutyl, isopentyl, sec-butyl, tert-butyl, neopentyl, 3,3-dimethylbutyl, 2-ethylhexyl, etc. Preferred alkyl groups are methyl, ethyl, tert-butyl and $CF_3$.

The cyclic alkyl radicals according to the present invention may optionally be substituted by substituents selected from the group consisting of aryl, alkoxy and halogen. The cyclic alkyl radicals are preferably unsubstituted. Suitable aryl substituents are specified below. Examples of suitable cyclic alkyl radicals are $C_3$- to $C_{20}$-cycloalkyl, preferably $C_3$- to $C_{10}$-cycloalkyl; particular preference is given to cyclopropyl, cyclobutyl, cyclopentyl, cyclohexyl, cycloheptyl, cyclooctyl, cyclononyl and cyclodecyl. If appropriate, the ring systems may also be polycyclic ring systems such as decalinyl, norbornanyl, bornanyl or adamantyl. The cyclic alkyl radicals may be unsubstituted or optionally substituted by one or more further radicals, especially alkyl, aryl, alkoxy and/or halogen.

Suitable halogen substituents in the context of the present application are fluorine, chlorine, bromine and iodine, preferably fluorine, chlorine and bromine, more preferably fluorine and chlorine.

Suitable alkoxy and alkylthio groups derive correspondingly from the alkyl radicals, as defined above. Examples here include $OCH_3$, $OC_2H_5$, $OC_3H_7$, $OC_4H_9$ and $OC_8H_{17}$, and also $SCH_3$, $SC_2H_5$, $SC_3H_7$, $SC_4H_9$ and $SC_8H_{17}$, $C_3H_7$, $C_4H_9$ and $C_8H_{17}$ are understood to mean both the n-isomers and branched isomers such as isopropyl, isobutyl, sec-butyl, tert-butyl and 2-ethylhexyl. Particularly preferred alkoxy or alkylthio groups are methoxy, ethoxy, n-octyloxy, 2-ethylhexyloxy and $SCH_3$.

In the present invention, aryl refers to radicals which are derived from monocyclic, bicyclic or tricyclic aromatics which do not comprise any ring heteroatoms. When the system is not a monocyclic system, the saturated form (perhydro form) or the partly unsaturated form (for example the dihydro form or tetrahydro form) are also possible for the second ring in case of the term "aryl", provided that the particular forms are known and stable. In other words, the term "aryl" in the present invention also comprises, for example, bicyclic or tricyclic radicals in which either both or all three radicals are aromatic, and also bicyclic or tricyclic radicals in which only one ring is aromatic, and also tricyclic radicals in which two rings are aromatic. Examples of aryl are: $C_6$-$C_{30}$-aryl, preferably $C_6$-$C_{18}$-aryl, where the number of carbon atoms is based on the aryl base skeleton, more preferably phenyl, naphthyl, indanyl, 1,2-dihydronaphthenyl, 1,4-dihydronaphthenyl, indenyl, anthracenyl, phenanthrenyl or 1,2,3,4-tetrahydronaphthyl. Aryl is more preferably phenyl or naphthyl, most preferably phenyl.

The aryl radicals may be unsubstituted or substituted by one or more further radicals. Suitable further radicals are selected from the group consisting of $C_1$-$C_{20}$-alkyl, $C_6$-$C_{30}$-aryl or substituents with donor or acceptor action, suitable substituents with donor or acceptor action being specified below. The aryl radicals are preferably unsubstituted or substituted by one or more $C_1$-$C_{20}$-alkoxy groups, CN, $CF_3$, F or amino groups (NR'R", where suitable R' and R" radicals are alkyl or aryl). Further preferred substitutions of the aryl radicals in the compounds of the compounds of the formula (III) specified below depend on the end use of the compounds of the general formula (III) and are specified below.

Suitable aryloxy, arylthio and arylcarbonyloxy groups derive correspondingly from the aforementioned aryl radicals as defined above. Particular preference is given to phenoxy, phenylthio and phenylcarbonyloxy.

Suitable amino groups have the general formula —NR'R" where R' and R" are each independently alkyl or aryl. Suitable alkyl and aryl radicals, each of which may optionally be substituted, are specified above. Examples of suitable amino groups are diarylamino groups such as diphenylamino and dialkylamino groups such as dimethylamino, diethylamino and arylalkylamino groups such as phenylmethylamino.

Heteroaryl having from 5 to 30 ring atoms is understood to mean unsubstituted or substituted heteroaryl, preferably mono-, bicyclic or tricyclic heteroaromatics which can be derived partly from the aforementioned aryl, in which at least one carbon atom in the aryl base skeleton has been replaced by a heteroatom. Preferred heteroatoms are N, O and S. The heteroaryl radicals more preferably have from 5 to 13 ring atoms. Especially preferably, the base skeleton of the heteroaryl radicals is selected from systems such as pyridine and five-membered heteroaromatics such as thiophene, pyrrole, imidazole or furan. These base skeletons may optionally be fused to one or two six-membered aromatic radicals. Suitable fused heteroaromatics are carbazolyl, benzimidazolyl, benzofuryl, dibenzofuryl or dibenzothiophenyl. The base skeleton may be substituted at one, more than one or all substitutable positions, suitable substituents being the same as have already been specified under the definition of $C_6$-$C_{30}$-aryl. However, the heteroaryl radicals are preferably unsubstituted. Suitable heteroaryl radicals are, for example, pyridin-2-yl, pyridin-3-yl, pyridin-4-yl, thiophen-2-yl, thiophen-3-yl, pyrrol-2-yl, pyrrol-3-yl, furan-2-yl, furan-3-yl and imidazol-2-yl, and also the corresponding benzofused radicals, especially carbazolyl, benzimidazolyl, benzofuryl, dibenzofuryl or dibenzothiophenyl.

Heterocyclic alkyl is understood to mean radicals which differ from the aforementioned cyclic alkyl in that, in the cyclic alkyl base skeleton, at least one carbon atom has been replaced by a heteroatom. Preferred heteroatoms are N, O and S. The base skeleton may be substituted at one, more than one or all substitutable positions, suitable substituents being the same as have already been specified under the definition of aryl. Mention should be made here in particular of the nitrogen-containing radicals pyrrolidin-2-yl, pyrrolidin-3-yl, piperidin-2-yl, piperidin-3-yl, piperidin-4-yl.

In the context of the present application, groups with donor or acceptor action are understood to mean the following groups:

Groups with donor action are understood to mean groups which have a +I und/oder +M effect, and groups with acceptor action are understood to mean groups which have a –I and/or –M effect. Preferred groups with donor or acceptor action are specified below:

$C_1$-$C_{20}$-alkoxy, $C_6$-$C_{30}$-aryloxy, $C_1$-$C_{20}$-alkylthio, $C_6$-$C_{30}$-arylthio, $SiR^{34}R^{35}R^{36}$, halogen radicals, halogenated $C_1$-$C_{20}$-alkyl radicals, carbonyl (—CO($R^{34}$)), carbonylthio (—C=O(S$R^{34}$)), carbonyloxy (—C=O(O$R^{34}$)), oxycarbonyl (—OC=O($R^{34}$)), thiocarbonyl (—SC=O($R^{34}$)), amino (—N$R^{34}R^{35}$), OH, pseudohalogen radicals, amido (—C=O(N$R^{34}$)), —N$R^{34}$C=O($R^{35}$), phosphonate (—P(O)(O$R^{34}$)$_2$, phosphate (—OP(O)(O$R^{34}$)$_2$), phosphine (—P$R^{34}R^{35}$), phosphine oxide (—P(O)$R^{34}_2$), sulfate (—OS(O)$_2$O$R^{34}$), sulfoxide (—S(O)$R^{34}$), sulfonate (—S(O)$_2$O$R^{34}$), sulfonyl (—S(O)$_2R^{34}$), sulfonamide (—S(O)$_2$N$R^{34}R^{35}$), NO$_2$, boronic esters (—OB(O$R^{34}$)$_2$), imino (—C=N$R^{34}R^{35}$)), borane radicals, stannane radicals, hydrazine radicals, hydrazone radicals, oxime radicals, nitroso groups, diazo groups, vinyl groups, sulfoximines, alanes, germanes, boroximes and borazines.

Preferred substituents with donor or acceptor action are selected from the group consisting of:

$C_1$- to $C_{20}$-alkoxy, preferably $C_1$-$C_6$-alkoxy, more preferably ethoxy or methoxy; $C_6$-$C_{30}$-aryloxy, preferably $C_6$-$C_{10}$-aryloxy, more preferably phenyloxy; $SiR^{34}R^{35}R^{36}$ where $R^{34}$, $R^{35}$ and $R^{36}$ are preferably each independently substituted or unsubstituted alkyl or substituted or unsubstituted phenyl; at least one of the $R^{34}$, $R^{35}$ or $R^{36}$ radicals is more preferably substituted or unsubstituted phenyl; at least one of the $R^{34}$, $R^{35}$ and $R^{36}$ radicals is most preferably substituted phenyl, where suitable substituents have been specified above; halogen radicals, preferably F, Cl, Br, more preferably F or Cl, most preferably F, halogenated $C_1$-$C_{20}$-alkyl radicals, preferably halogenated $C_1$-$C_6$-alkyl radicals, most preferably fluorinated $C_1$-$C_6$-alkyl radicals, e.g. $CF_3$, $CH_2F$, $CHF_2$ or $C_2F_5$; amino, preferably dimethylamino, diethylamino or diphenylamino; OH, pseudohalogen radicals, preferably CN, SCN or OCN, more preferably CN, —C(O)O$C_1$-$C_4$-alkyl, preferably —C(O)OMe, P(O)$R_2$, preferably P(O)$Ph_2$, or $SO_2R_2$, preferably $SO_2Ph$.

Very particularly preferred substituents with donor or acceptor action are selected from the group consisting of methoxy, phenyloxy, halogenated $C_1$-$C_4$-alkyl, preferably $CF_3$, $CH_2F$, $CHF_2$, $C_2F_5$, halogen, preferably F, CN, $SiR^{34}R^{35}R^{36}$, where suitable $R^{34}$, $R^{35}$ and $R^{36}$ radicals have already been mentioned, diphenylamino, —C(O)O$C_1$-$C_4$-alkyl, preferably —C(O)OMe, P(O)$Ph_2$, $SO_2Ph$.

The aforementioned groups with donor or acceptor action are not intended to rule out the possibility that further aforementioned radicals and groups may also have donor or acceptor action. For example, the aforementioned heteroaryl radicals are likewise groups with donor or acceptor action, and the $C_1$-$C_{20}$-alkyl radicals are groups with donor action.

The $R^{34}$, $R^{35}$ and $R^{36}$ radicals mentioned in the aforementioned groups with donor or acceptor action are each as already defined above, i.e. $R^{34}$, $R^{35}$, $R^{36}$ are each independently:

Substituted or unsubstituted $C_1$-$C_{20}$-alkyl or substituted or unsubstituted $C_6$-$C_{30}$-aryl, where suitable and preferred alkyl and aryl radicals are specified above. More preferably, the $R^{34}$, $R^{35}$ and $R^{36}$ radicals are $C_1$-$C_6$-alkyl, e.g. methyl, ethyl or i-propyl, phenyl or benzyl. In a preferred embodiment—in the case of $SiR^{34}R^{35}R^{36}$—$R^{34}$, $R^{35}$ and $R^{36}$ are preferably each independently substituted or unsubstituted $C_1$-$C_{20}$-alkyl or substituted or unsubstituted phenyl; more preferably, at least one of the $R^{34}$, $R^{35}$ and $R^{36}$ radicals is substituted or unsubstituted phenyl; most preferably, at least one of the $R^{34}$, $R^{35}$ and $R^{36}$ radicals is substituted phenyl, where suitable substituents have been specified above.

Preferred carbene ligands of the formula II are likewise the carbene ligands disclosed in European application 06112198.4. Particularly preferred carbene ligands have the following general formulae aa to ae:

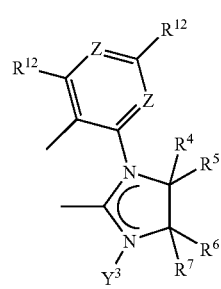

aa

-continued

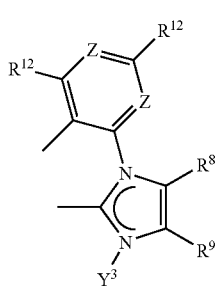

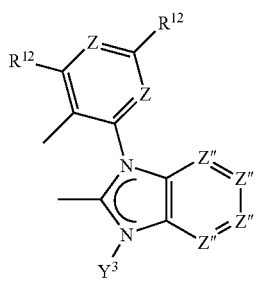

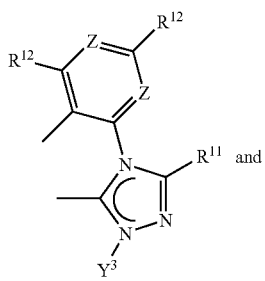

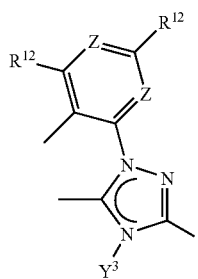

where the symbols are each defined as follows:

Y³ is an alkyl, alkynyl or alkenyl radical,
or a group of the following structure:

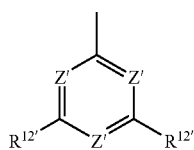

Z is the same or different and is $CR^{12}$ or N;
Z' is the same or different and is $CR^{12'}$ or N;
Z" is the same or different and is $CR^{10}$ or N;
$R^{12}$, $R^{12'}$ are the same or different and are each independently H, an alkyl, aryl, heteroaryl, alkynyl or alkenyl radical, or in each case two $R^{12}$ and/or $R^{12'}$ radicals together form a fused ring which may optionally comprise at least one heteroatom, or $R^{12}$ and/or $R^{12'}$ is a radical with donor or acceptor action;

$R^4$, $R^5$, $R^6$, $R^7$, $R^8$, $R^9$, $R^{11}$ and $R^{11'}$
are each hydrogen, alkyl, aryl, heteroaryl, alkynyl or alkenyl, or a radical with donor or acceptor action;

$R^{10}$ in the Z" groups are each independently H, alkyl, aryl, heteroaryl, alkynyl or alkenyl, or in each case two $R^{10}$ radicals together form a fused ring which may optionally comprise at least one heteroatom, or $R^{10}$ is a radical with donor or acceptor action;

in addition, the group of the structure

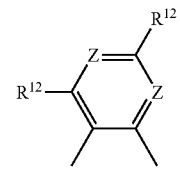

via the aromatic base structure or via one of the $R^{12}$ radicals, may be bonded via a bridge to $R^4$ or $R^5$ or the carbon atom to which $R^4$ and $R^5$ are bonded in the moiety aa, $R^8$ or the carbon atom to which $R^8$ is bonded in the moiety ab, one of the $R^{10}$ radicals or one of the carbon atoms to which $R^{10}$ is bonded in the moiety ac, and $R^{11}$ or the carbon atom to which $R^{11}$ is bonded in the moiety ad;
and/or
the group of the structure

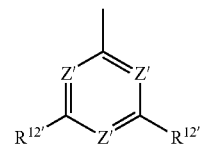

via the aromatic base structure or via one of the $R^{12'}$ radicals, may be bonded via a bridge to $R^6$ or $R^7$ or the carbon atom to which $R^6$ or $R^7$ are bonded in the moiety aa, $R^9$ or the carbon atom to which $R^9$ is bonded in the moiety ab, one of the $R^{10}$ radicals or one of the carbon atoms to which $R^{10}$ is bonded in the moiety ac, and $R^{11'}$ or the carbon atom to which $R^{11'}$ is bonded in the moiety ae;
where the bridge in each case may be defined as follows:
alkylene, arylene, heteroarylene, alkynylene, alkenylene, $NR^{18}$, $PR^{19}$, $BR^{20}$, O, S, SO, $SO_2$, $SiR^{30}R^{31}$, CO, CO—O, O—CO and $(CR^{21}R^{22})_x$, where one or more nonadjacent $(CR^{21}R^{22})$ groups may be replaced by $NR^{18}$, $PR^{19}$, $BR^{20}$, O, S, SO, $SO_2$, $SiR^{30}R^{31}$, CO, CO—O, O—CO, where
x is from 2 to 10;
and
$R^{18}$, $R^{19}$, $R^{20}$, $R^{21}$, $R^{22}$, $R^{30}$, $R^{31}$
are each H, alkyl, aryl, heteroaryl, alkynyl, alkenyl;
where, in the cases in which the group of the structure

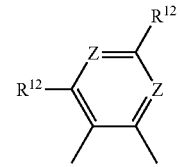

is bonded via a bridge to the carbon atom to which $R^4$ and $R^5$ are bonded (moiety aa), the carbon atom to which $R^8$ is bonded (moiety ab), one of the carbon atoms to which $R^{10}$ is bonded (moiety ac) or the carbon atom to which $R^{11}$ is bonded (moiety ad), the particular $R^4$ or $R^5$ radical, $R^8$, one of the $R^{10}$ radicals or $R^{11}$ is replaced by a bond to the bridge;
and, in the cases in which the group of the structure

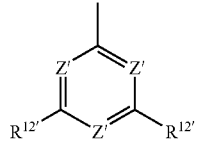

is bonded via a bridge to the carbon atom to which $R^6$ and $R^7$ are bonded (moiety aa), the carbon atom to which $R^9$ is bonded (moiety ab), one of the carbon atoms to which $R^{10}$ is bonded (moiety ac) or the carbon atom to which $R^{11}$ is bonded (moiety ad), the particular $R^6$ or $R^7$ radical, $R^9$, one of the $R^{10}$ radicals or $R'''$ is replaced by a bond to the bridge.

The carbene ligand may either be "symmetrical" or "unsymmetrical". A "symmetrical" carbene ligand is understood to mean a carbene ligand in which $Y^3$ is a group of the following structure

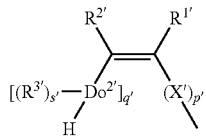

where the symbols Z' and $R^{12'}$ are each as defined above;
an "unsymmetrical" carbene ligand is understood to mean a carbene ligand in which $Y^3$ is hydrogen, an alkyl, an alkynyl or an alkenyl radical, preferably an alkyl, alkynyl or alkenyl radical, both preferred alkyl, alkynyl or alkenyl radicals and preferred groups of the formula

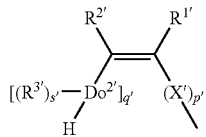

being specified, for example, in European application 06112198.4.

Preferred "symmetrical" carbene complexes are disclosed, for example, in WO 05/019373.

Particularly preferred "symmetrical" carbene complexes are Ir-carbene complexes of the general formulae Ia to Id

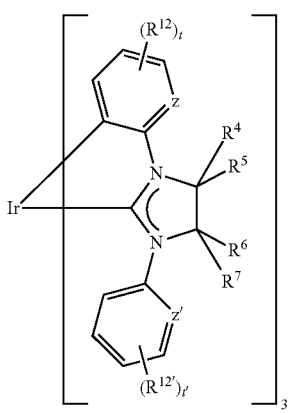

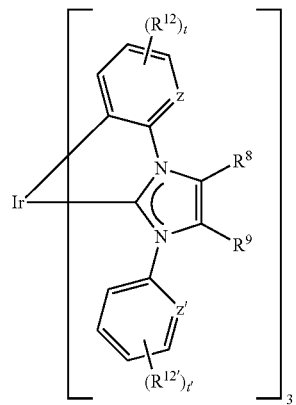

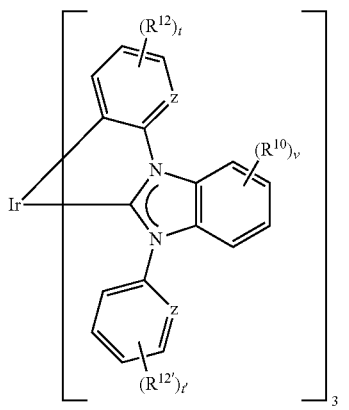

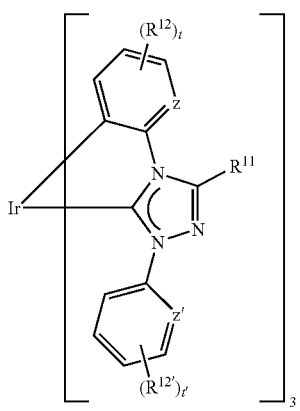

in which $R^4$, $R^5$, $R^6$, $R^7$, $R^8$, $R^9$, $R^{10}$ and $R^{12}$ and $R^{12'}$ are each as defined above,
Z, Z' are the same or different and are each CH or N;
t and t' are the same or different, preferably the same, and are from 0 to 3, where the $R^{12}$ and $R^{12'}$ radicals may be the same or different when t or t' is >1; t or t' is preferably 0 or 1; when t or t' is 1, the $R^{12}$ or $R^{12'}$ radical is in the ortho, meta or para position to the bonding site with the nitrogen atom adjacent to the carbene carbon atom; and
v is from 0 to 4, preferably 0, 1 or 2, most preferably 0, where the four carbon atoms of the aryl radical in formula Ic, each of which is optionally substituted by $R^{10}$, bear hydrogen atoms when v is 0.

Particular preference is given to "symmetrical" carbene complexes of the formula Ia to Id, in which Z and Z' are each CH, $R^8$ and $R^9$ are each H, t, t' and v are each 0, and the remaining radicals are each as defined above.

Very particularly preferred "symmetrical" carbene complexes are carbene complexes of the formulae Ib and Ic, where $R^8$ and $R^9$ in the carbene complexes of the formula Ib are most preferably H, and t and t' in the carbene complexes of the formulae Ib and Ic are each independently 0 or 1, where $R^{12}$ and $R^{12'}$ are more preferably each an alkyl radical or a group with donor or acceptor action, for example selected from the group consisting of F, alkoxy, aryloxy, carbonyl, ester, amino groups, amide radicals, $CHF_2$, $CH_2F$, $CF_3$, CN, thio groups and SCN, and v in the carbene complexes of the formula Ic is more preferably 0.

Preferred "unsymmetrical" carbene complexes are disclosed in WO 06/056418.

Particularly preferred "unsymmetrical" carbene complexes are Ir-carbene complexes which have the general formulae Ie to Ii.

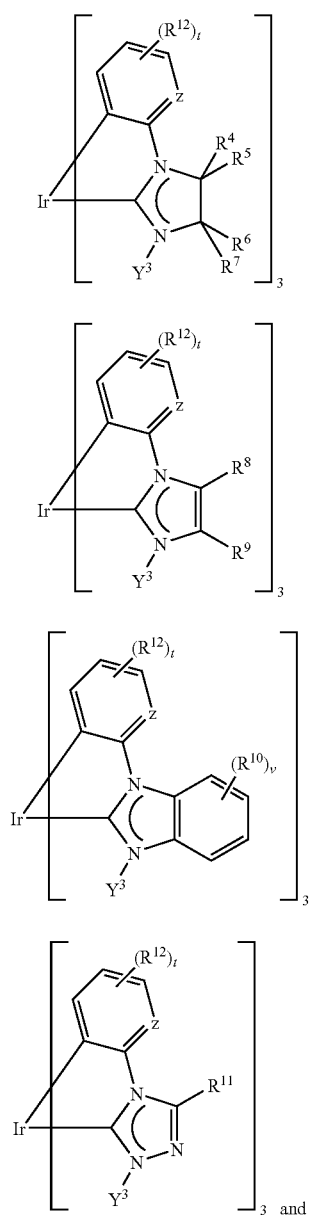

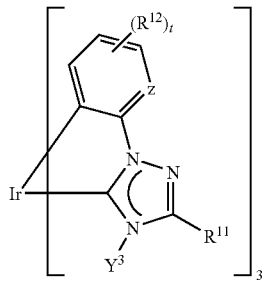

where $R^4$, $R^5$, $R^6$, $R^7$, $R^8$, $R^9$, $R^{11}$, $R^{11'}$, $R^{12}$, Z and Z" are each as defined for the "symmetrical" carbene complexes; and $Y^3$ is hydrogen, an alkyl, aryl, heteroaryl, alkynyl or alkenyl radical, preferably an alkyl, heteroaryl or aryl radical, more preferably an alkyl radical.

Very particular preference is given to "unsymmetrical" carbene complexes of the formulae If and Ig.

Very particular preference is given to "unsymmetrical" carbene complexes in which Z is $CR^{12}$, Z" is CH and $Y^3$ is alkyl, where $R^{12}$ is more preferably hydrogen, alkyl or a radical with donor or acceptor action, for example selected from the group consisting of F, alkoxy, aryloxy, carbonyl, ester, amino groups, amide radicals, $CHF_2$, $CH_2F$, $CF_3$, CN, thio groups and SCN, where three of the four possible substituents $R^{12}$ are preferably hydrogen and one of the $R^{12}$ radicals is hydrogen, alkyl or a radical with donor or acceptor action.

In addition to the homoleptic carbene complexes shown above, i.e. carbene complexes which bear identical carbene ligands, heteroleptic carbene complexes, as disclosed, for example, in European application 06112228.9 are also suitable. Additionally suitable are carbene complexes which, as well as carbene ligands, bear further noncarbene ligands. Suitable complexes which, as well as carbene ligands, bear noncarbene ligands are disclosed, for example, in European application 06112198.4. In addition, it is possible to use specific transition metal-carbene complexes, as disclosed in European applications 06112198.4 and 06116100.6, in the inventive OLEDs.

The carbene complexes used with preference in the inventive OLEDs can be prepared by processes known to those skilled in the art. Suitable preparation processes are disclosed, for example, in WO 05/019373, WO 06/056418, in European applications 06101109.4, 06112198.4, 06112228.9, 06116100.6 and 06116093.3, and the literature cited therein.

The phosphorescence emitter CB used in the light-emitting layer C in the inventive OLED is preferably a carbene complex, more preferably a carbene complex as defined above.

In a further preferred embodiment, the at least one hole-conducting material of the hole-conducting layer B and/or the at least one hole-conducting material CA of the light-emitting layer C is a carbene complex, preferably a carbene complex as defined above. The carbene complexes of the hole-conducting materials in layers B and C may be the same or different.

In a particularly preferred embodiment, the phosphorescence emitter CB used in the light-emitting layer C and the at least one hole-conducting material CA in the light-emitting layer C and the at least one hole-conducting material of the hole-conducting layer B are each a carbene complex. The carbene complexes of the hole-conducting material in the hole-conducting layer B and in the light-emitting layer C are different from the carbene complex of the phosphorescence emitter CB in the light-emitting layer C, the band gap of the carbene complexes used as the hole-conducting material being greater than the band gap of the carbene complex which is used as the phosphorescence emitter.

Electron-Conducting Layer D

Suitable materials for the electron-conducting layer (also known as electron transport layer) are known to those skilled in the art. Examples of a suitable electron-conducting layer are electron-conducting layers based on aluminum tris-8-hydroxyquinolinate ($AlQ_3$) or 1,3,5-tris(N-phenyl-2-benzylimidazolyl)benzene (TPBI).

Cathode E

Suitable cathode materials are typically metals, metal combinations or metal alloys with low work function. Examples are Ca, Ba, Cs, Mg, Al, In and Mg/Ag. Suitable cathode materials are known to those skilled in the art.

OLED Structure

The inventive OLED may have further layers in addition to layers A, B, C, D and E.

The organic light-emitting diode preferably has, between the light-emitting layer C and the electron-conducting layer D, in direct contact to the light-emitting layer C, a hole-blocking layer formed from at least one hole blocker material and/or exciton blocker material, in which case the hole blocker material may serve simultaneously as the exciton blocker material. It is likewise possible that the electron-conducting layer D simultaneously serves as the hole-blocking layer.

In a further embodiment, the organic light-emitting diode has an electron-blocking layer formed from at least one electron blocker material and/or exciton blocker layer between the hole-conducting layer B and the light-emitting layer C.

In addition, the inventive organic light-emitting diode, in addition to layers A to E and, if appropriate, the hole-blocking layer, may comprise further layers, for example a hole injection layer between the anode A and the hole-conducting layer B, suitable materials for the hole injection layer being known to those skilled in the art. Examples of suitable materials are materials based on copper phthalocyanine (CuPc) or conductive polymers such as polyaniline (PANI) or polythiophene derivatives such as PEDOT. In addition, the inventive OLED may comprise one or more electron injection layers which is/are arranged between the electron-conducting layer and the cathode, and this layer may coincide partly with one of the other layers, or be formed from part of the cathode. Typically, the electron injection layers are thin films formed from a material with a high dielectric constant, for example LiF, $Li_2O$, $BaF_2$, MgO and/or NaF.

The inventive organic light-emitting diode may comprise, in at least one of the layers of the organic light-emitting diode, preferably in the hole-blocking layer and/or the electron-blocking layer and/or the light-emitting layer C, in addition to the hole-conducting material CA and the emitter CB, at least one compound selected from disilylcarbazoles, disilyldibenzofurans, disilyldibenzothiophenes, disilyldibenzophospholes, disilyldibenzothiophene S-oxides and disilyldibenzothiophene S,S-dioxides of the general formula III

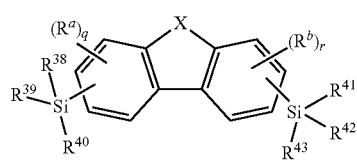

(III)

in which:

X is $NR^{37}$, S, O, $PR^{37}$, $SO_2$ or SO;

$R^{37}$ is substituted or unsubstituted $C_1$-$C_{20}$-alkyl, substituted or unsubstituted $C_6$-$C_{30}$-aryl, or substituted or unsubstituted heteroaryl having from 5 to 30 ring atoms;

$R^{38}$, $R^{39}$, $R^{40}$, $R^{41}$, $R^{42}$, $R^{43}$ are each independently substituted or unsubstituted $C_1$-$C_{20}$-alkyl, or substituted or unsubstituted $C_6$-$C_{30}$-aryl, or a structure of the general formula (c)

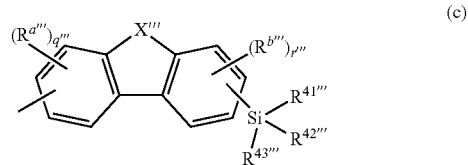

(c)

$R^a$, $R^b$ are each independently substituted or unsubstituted $C_1$-$C_{20}$-alkyl, substituted or unsubstituted $C_6$-$C_{30}$-aryl, or substituted or unsubstituted heteroaryl having from 5 to 30 ring atoms or a substituent with donor or acceptor action selected from the group consisting of: $C_1$-$C_{20}$-alkoxy, $C_6$-$C_{30}$-aryloxy, $C_1$-$C_{20}$-alkylthio, $C_6$-$C_{30}$-arylthio, $SiR^{34}R^{35}R^{36}$, halogen radicals, halogenated $C_1$-$C_{20}$-alkyl radicals, carbonyl (—CO($R^{34}$)), carbonylthio (—C=O($SR^{34}$)), carbonyloxy (—C=O($OR^{34}$)), oxycarbonyl (—OC=O($R^{34}$)), thiocarbonyl (—SC=O($R^{34}$)), amino (—$NR^{34}R^{35}$), OH, pseudohalogen radicals, amido (—C=O($NR^{34}$)), —$NR^{34}$C=O($R^{35}$), phosphonate (—P(O)($OR^{34}$)$_2$, phosphate (—OP(O)($OR^{34}$)$_2$), phosphine (—$PR^{34}R^{35}$), phosphine oxide (—P(O)$R^{34}_2$), sulfate (—OS(O)$_2OR^{34}$), sulfoxide (S(O)$R^{34}$), sulfonate (—S(O)$_2OR^{34}$), sulfonyl (—S(O)$_2R^{34}$), sulfonamide (—S(O)$_2NR^{34}R^{35}$), $NO_2$, boronic esters (—OB($OR^{34}$)$_2$), imino (—C=$NR^{34}R^{35}$)), borane radicals, stannane radicals, hydrazine radicals, hydrazone radicals, oxime radicals, nitroso groups, diazo groups, vinyl groups, sulfoximines, alanes, germanes, boroximes and borazines;

$R^{34}R^{35}$, $R^{36}$ are each independently substituted or unsubstituted $C_1$-$C_{20}$-alkyl, or substituted or unsubstituted $C_6$-$C_{30}$-aryl;

q,r are each independently 0, 1, 2 or 3; where, in the case when q or r is 0, all substitutable positions of the aryl radical are substituted by hydrogen, where the radicals and indices in the group of the formula (c) $X'''$, $R^{41'''}$, $R^{42'''}$, $R^{43'''}$, $R^{a'''}R^{b'''}$, q''' and r''' are each independently as defined for the radicals and indices of the compounds of the general formula III X, $R^{41}$, $R^{42}$, $R^{43}$, $R^a$, $R^b$, q and r. Suitable definitions for the aforementioned radicals and groups alkyl, aryl, heteroaryl, substituents with donor or acceptor action, alkoxy, aryloxy, alkylthio, arylthio, halogen, amino and amido are mentioned above.

Preferred $R^{38}$ to $R^{43}$, $R^a$ and $R^b$ radicals and groups depend on the layer of the inventive OLED in which the compounds of the formula III are used, and on the electronic properties (positions of HOMOs and LUMOs) of the particular layers used in the inventive OLED. It is thus possible, by virtue of suitable substitution of the compounds of the formula III, to adjust the HOMO and LUMO orbital positions to the further layers used in the inventive OLED and thus to achieve a high stability of the OLED and hence a long operative lifetime and/or an improved efficiency.

Suitable hole blocker materials are known to those skilled in the art. Customary materials are 2,9-dimethyl-4,7-diphenyl-1,10-phenanthroline (bathocuproin, (BCP)), bis(2-methyl-8-quinolinato)-4-phenylphenylato)aluminum(III) (BAlq), phenothiazine derivatives and 1,3,5-tris(N-phenyl-2-benzylimidazolyl)benzene (TPBI), TPBI also being suitable as an electron-conducting material. In addition 9-(4-tert-butylphenyl)-3,6-bis(triphenylsilyl)carbazole (CzSi) and 9-(phenyl)-3,6-bis(triphenylsilyl)carbazole, can also be used as hole blocker materials.

In addition to the 3,6-disilylcarbazoles of the formula III which have been mentioned as hole blocker materials, (9-(4-tert-butylphenyl)-3,6-bis(triphenylsilyl)carbazole and 9-(phenyl)-3,6-bis(triphenylsilyl)carbazole, in which:
$R^{37}$ is 4-tert-butylphenyl in the case of 9-(4-tert-butylphenyl)-3,6-bis(triphenylsilyl)carbazole, or unsubstituted phenyl in the case of 9-(phenyl)-3,6-bis(triphenylsilyl)carbazole, $R^{38}$, $R^{39}$, $R^{40}$, $R^{41}$, $R^{42}$, $R^{43}$
are each unsubstituted phenyl; and
q und r
are each 0,
suitable hole blocker materials are the further aforementioned compounds of the formula III. Preferred compounds of the formula III are specified below.

The compounds of the formula III are disilyl compounds in which the radicals and indices are each defined as follows:
X is $NR^{37}$, S, O, $PR^{37}$, $SO_2$ or SO; preferably $NR^{37}$, S or O;
$R^{37}$ is substituted or unsubstituted $C_1$-$C_{20}$-alkyl, substituted or unsubstituted $C_6$-$C_{30}$-aryl, or substituted or unsubstituted heteroaryl having from 5 to 30 ring atoms; preferably substituted or unsubstituted $C_6$-$C_{30}$-aryl, more preferably substituted or unsubstituted $C_6$-$C_{10}$-aryl or unsubstituted $C_1$-$C_{20}$-alkyl, most preferably substituted or unsubstituted phenyl, suitable substituents having been specified above;
$R^{38}$, $R^{39}$, $R^{40}$, $R^{41}$, $R^{42}$, $R^{43}$
are each independently substituted or unsubstituted $C_1$-$C_{20}$-alkyl or substituted or unsubstituted $C_6$-$C_{30}$-aryl or a structure of the general formula (c);
preferably at least one of the $R^{38}$, $R^{39}$ and $R^{40}$ radicals and/or at least one of the $R^{41}$, $R^{42}$ and $R^{43}$ radicals is substituted or unsubstituted $C_6$-$C_{30}$-aryl, more preferably substituted or unsubstituted $C_6$-$C_{10}$-aryl, most preferably substituted or unsubstituted phenyl, suitable substituents having been specified above, and/or one of the $R^{38}$, $R^{39}$ and $R^{40}$ radicals and/or one of the $R^{41}$, $R^{42}$ and $R^{43}$ radicals is a radical of the structure (c);
$R^a$, $R^b$ are each independently substituted or unsubstituted $C_1$-$C_{20}$-alkyl, substituted or unsubstituted $C_6$-$C_{30}$-aryl, substituted or unsubstituted heteroaryl having from 5 to 30 ring atoms, or a substituent with donor or acceptor action, suitable and preferred substituents with donor or acceptor action having been specified above;
$R^{34}$, $R^{35}$, $R^{36}$
are each independently substituted or unsubstituted $C_1$-$C_{20}$-alkyl or substituted or unsubstituted $C_6$-$C_{30}$-aryl, preferably substituted or unsubstituted $C_1$-$C_6$-alkyl or substituted or unsubstituted $C_6$-$C_{10}$-aryl, where $R^{34}$, $R^{35}$ and $R^{36}$ are more preferably each independently substituted or unsubstituted $C_1$-$C_{20}$-alkyl or substituted or unsubstituted phenyl; more preferably, at least one of the $R^{34}$, $R^{35}$ and $R^{36}$ radicals is substituted or unsubstituted phenyl; most preferably, at least one of the $R^{34}$, $R^{35}$ and $R^{36}$ radicals is substituted phenyl, suitable substituents having been specified above;
q,r are each independently 0, 1, 2 or 3, where, when q or r is 0, all substitutable positions of the aryl radical bear hydrogen atoms, preferably 0.

In one embodiment, the present invention relates to an inventive organic light-emitting diode in which the X group in the compounds of the formula III is $NR^{37}$, where the $R^{37}$ radical has already been defined above, in which at least one of the $R^{37}$ to $R^{43}$, $R^a$ or $R^b$ radicals in the compounds of the formula III comprises at least one heteroatom. Preferred heteroatoms are N, Si, halogen, especially F or Cl, O, S or P. The heteroatom may be present in the form of a substituent of at least one of the $R^{37}$ to $R^{43}$, $R^a$ or $R^b$ radicals, or in the form of part of a substituent, or be present in the base skeleton of at least one of the $R^{37}$ to $R^{43}$, $R^a$ or $R^b$ radicals. Suitable substituents or base skeletons are known to those skilled in the art and are specified under the definitions of the $R^{37}$ to $R^{43}$, $R^a$ or $R^b$ radicals.

A preferred embodiment of the present invention relates to an organic light-emitting diode according to the present invention, in which at least one of the $R^{38}$, $R^{39}$ and $R^{40}$ and/or at least one of the $R^{41}$, $R^{42}$ and $R^{43}$ radicals in the compounds of the formula III is substituted or unsubstituted $C_6$-$C_{30}$-aryl. Preferred aryl radicals and their substituents have already been specified above.

A further embodiment of the present invention relates to an inventive organic light-emitting diode in which the compound of the general formula III is a 3,6-disilyl-substituted compound of the general formula IIIa:

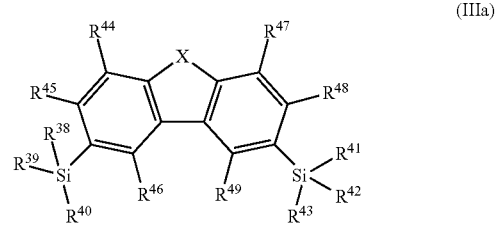

(IIIa)

in which:
X is $NR^{37}$, S, O, $PR^{37}$, $SO_2$ or SO; preferably $NR^{37}$, S or O; more preferably $NR^{37}$;
$R^{37}$ is substituted or unsubstituted $C_1$-$C_{20}$-alkyl, substituted or unsubstituted $C_6$-$C_{30}$-aryl, or substituted or unsubstituted heteroaryl having from 5 to 30 ring atoms; preferably substituted or unsubstituted $C_6$-$C_{30}$-aryl or substituted or unsubstituted $C_1$-$C_{20}$-alkyl, more preferably substituted or unsubstituted $C_6$-$C_{10}$-aryl or unsubstituted $C_6$-$C_{10}$-aryl, most preferably substituted or unsubstituted phenyl, suitable substituents having been specified above;
$R^{38}$, $R^{39}$, $R^{40}$, $R^{41}$, $R^{42}$, $R^{43}$
are each independently substituted or unsubstituted $C_1$-$C_{20}$-alkyl or substituted or unsubstituted $C_6$-$C_{30}$-aryl or a structure of the general formula (c);
preferably at least one of the $R^{38}$, $R^{39}$ and $R^{40}$ radicals and/or at least one of the $R^{41}$, $R^{42}$ and $R^{43}$ radicals is substituted or unsubstituted $C_6$-$C_{30}$-aryl, more preferably substituted or unsubstituted $C_6$-$C_{10}$-aryl, most preferably substituted or unsubstituted phenyl, suitable substituents having been specified above, and/or one of the $R^{38}$, $R^{39}$ and $R^{40}$ radicals and/or one of the $R^{41}$, $R^{42}$ and $R^{43}$ radicals is a radical of the structure (c);
$R^{44}$, $R^{45}$, $R^{46}$, $R^{47}$, $R^{48}$, $R^{49}$
are each independently hydrogen or are as defined for $R^a$ and $R^b$, i.e. are each independently substituted or unsubstituted $C_1$-$C_{20}$-alkyl, substituted or unsubstituted $C_6$-$C_{20}$-aryl, substituted or unsubstituted heteroaryl having from 5 to 30 ring atoms or a substituent having donor or acceptor action, suitable substituents with donor or acceptor action having been specified above; preferably hydrogen, substituted or unsubstituted $C_1$-$C_6$-alkyl, substituted or unsubstituted $C_6$-$C_{10}$-aryl or $SiR^{34}R^{35}R^{36}$; more preferably hydrogen, methyl, ethyl, phenyl, $CF_3$ or $SiR^{34}R^{35}R^{36}$, where $R^{34}$, $R^{35}$ and $R^{36}$ are preferably each independently substituted or unsubstituted $C_1$-$C_{20}$-alkyl or substituted or unsubstituted phenyl; more preferably, at least one of the $R^{34}$, $R^{35}$ and $R^{36}$ radicals is substituted or unsubstituted phenyl; most preferably, at least one of the $R^{34}$, $R^{35}$ and $R^{36}$ radicals is substituted phenyl, suitable substituents having been specified above;

and the further radicals and indices $R^{34}$, $R^{35}$, $R^{36}$ are each as defined above.

In a particularly preferred embodiment, the compounds of the formula (II) used in the inventive organic light-emitting diodes have the following definitions for the $R^{37}$ to $R^{43}$, $R^a$ and $R^b$ radicals and the X group:

X is $NR^{37}$;

$R^{37}$ is substituted or unsubstituted $C_6$-$C_{30}$-aryl, preferably substituted or unsubstituted $C_6$-$C_{10}$-aryl, more preferably substituted or unsubstituted phenyl, suitable substituents having been specified above;

$R^{38}$, $R^{39}$, $R^{40}$, $R^{41}$, $R^{42}$, $R^{43}$ are each independently substituted or unsubstituted $C_1$-$C_{20}$-alkyl or substituted or unsubstituted $C_6$-$C_{30}$-aryl, or a structure of the general formula (c), preferably each independently substituted or unsubstituted $C_1$-$C_6$-alkyl or substituted or unsubstituted $C_6$-$C_{10}$-aryl, more preferably substituted or unsubstituted $C_1$-$C_6$-alkyl or substituted or unsubstituted phenyl; where, in one embodiment, at least one of the $R^{38}$, $R^{39}$ and $R^{40}$ radicals and/or at least one of the $R^{41}$, $R^{42}$ and $R^{43}$ radicals is substituted or unsubstituted $C_6$-$C_{30}$-aryl, preferably substituted or unsubstituted $C_6$-$C_{10}$-aryl, more preferably substituted or unsubstituted phenyl; preferred substituents having been specified above;

$R^{44}$, $R^{45}$, $R^{46}$, $R^{47}$, $R^{48}$, $R^{49}$ are each independently hydrogen or are each as defined for $R^a$ and $R^b$, i.e. are each independently substituted or unsubstituted $C_1$-$C_{20}$-alkyl, substituted or unsubstituted $C_6$-$C_{30}$-aryl, substituted or unsubstituted heteroaryl having from 5 to 30 ring atoms or a substituent having donor or acceptor action, suitable substituents with donor or acceptor action already having been specified above; preferably hydrogen, substituted or unsubstituted $C_1$-$C_6$-alkyl, substituted or unsubstituted $C_6$-$C_{10}$-aryl or $SiR^{34}R^{35}R^{36}$; more preferably hydrogen, methyl, ethyl, phenyl, $CF_3$ or $SiR^{34}R^{35}R^{36}$;

$R^{34}$, $R^{35}$, $R^{36}$ are each independently substituted or unsubstituted $C_1$-$C_{20}$-alkyl or substituted or unsubstituted $C_6$-$C_{30}$-aryl, preferably substituted or unsubstituted $C_1$-$C_6$-alkyl or substituted or unsubstituted $C_6$-$C_{10}$-aryl, where $R^{34}$, $R^{35}$ and $R^{36}$ are more preferably each independently substituted or unsubstituted $C_1$-$C_{20}$-alkyl or substituted or unsubstituted phenyl; more preferably, at least one of the $R^{34}$, $R^{35}$ and $R^{36}$ radicals is substituted or unsubstituted phenyl; most preferably, at least one of the $R^{34}$, $R^{35}$ and $R^{36}$ radicals is substituted phenyl, suitable substituents having been specified above.

In a further preferred embodiment, the present invention relates to an organic light-emitting diode in which a compound of the formula III is used, in which the $R^{37}$ radical and/or at least one of the radicals from the group of $R^{38}$, $R^{39}$ and $R^{40}$ and/or at least one of the radicals from the group of $R^{41}$, $R^{42}$ and $R^{43}$ is independently substituted or unsubstituted $C_6$-aryl of the following formula:

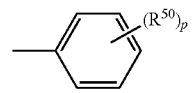

in which p is 0, 1, 2, 3, 4 or 5, preferably 0, 1, 2 or 3, more preferably 0, 1 or 2;

$R^{50}$ is hydrogen, substituted or unsubstituted $C_1$-$C_{20}$-alkyl, substituted or unsubstituted $C_6$-$C_{30}$-aryl, substituted or unsubstituted heteroaryl having from 5 to 30 ring atoms, a substituent with donor or acceptor action, suitable substituents with donor or acceptor action having been specified above, or a radical of the general formula a or b

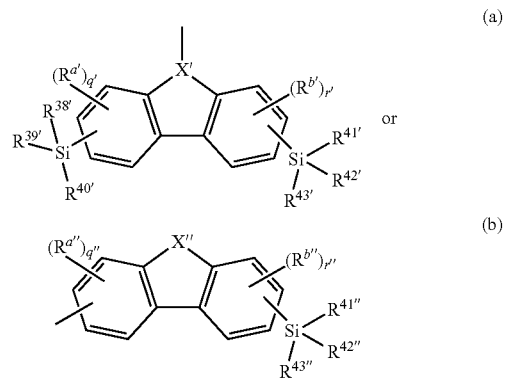

in which

X' is N or P, and the radicals and indices X'', $R^{38'}$, $R^{39'}$, $R^{40'}$, $R^{41'}$, $R^{41''}$ $R^{42'}$, $R^{42''}$, $R^{43'}$, $R^{43''}$, $R^{a'}$, $R^{a''}$, $R^{b'}$, $R^{b''}$, q', q'', r' and r'' are each independently as defined for the radicals and indices X, $R^{38}$, $R^{39}$, $R^{40}$, $R^{41}$, $R^{42}$, $R^{43}$, $R^a$, $R^b$, q and r;

or one of the $R^{38}$, $R^{39}$ and $R^{40}$ radicals and/or one of the $R^{41}$, $R^{42}$ and $R^{43}$ radicals is a radical of the general formula c

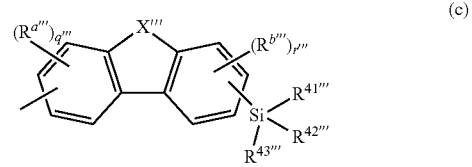

in which the radicals and indices X''', $R^{41'''}$, $R^{42'''}$, $R^{43'''}$, $R^{a'''}$, $R^{b'''}$, q''' and r''' are each independently as defined for the radicals and indices X, $R^{41}$, $R^{42}$, $R^{43}$, $R^a$, $R^b$, q and r.

Preferred $R^{50}$ radicals are selected from the group consisting of hydrogen, substituted or unsubstituted $C_1$-$C_6$-alkyl, substituted or unsubstituted $C_6$-$C_{10}$-aryl, substituted or unsubstituted heteroaryl having from 5 to 13 ring atoms, preferably carbazolyl, a substituent with donor or acceptor action selected from the group consisting of $C_1$- to $C_{20}$-alkoxy, preferably $C_1$-$C_6$-alkoxy, more preferably ethoxy or methoxy; $C_6$-$C_{30}$-aryloxy, preferably $C_6$-$C_{10}$-aryloxy, more preferably phenyloxy; $SiR^{34}R^{35}R^{36}$; halogen radicals, preferably F, Cl, Br, more preferably F or Cl, most preferably F, halogenated $C_1$-$C_{20}$-alkyl radicals, preferably halogenated $C_1$-$C_6$-alkyl radicals, most preferably fluorinated $C_1$-$C_6$-alkyl radicals, e.g. $CF_3$, $CH_2F$, $CHF_2$ or $C_2F_5$; amino, preferably dimethylamino, diethylamino or diphenylamino, more preferably diphenylamino; OH, pseudohalogen radicals, preferably CN, SCN or OCN, more preferably CN; C(O)OC$_1$-C$_4$-alkyl, preferably —C(O)OMe, P(O)Ph$_2$, SO$_2$Ph, where $R^{34}$, $R^{35}$ and $R^{36}$ are each independently substituted or unsubstituted $C_1$- to $C_6$-alkyl or substituted or unsubstituted $C_6$- to $C_{10}$-aryl and—in the case of $SiR^{34}R^{35}R^{36}$—are preferably each independently substituted or unsubstituted alkyl or substituted or unsubstituted phenyl; more preferably, at least one of the $R^{34}$, $R^{35}$ and $R^{36}$ radicals is substituted or unsubstituted phenyl; most preferably, at least one of the $R^{34}$, $R^{35}$ and $R^{36}$ radicals is substituted phenyl, suitable substituents having been specified above. More preferably, the $R^{50}$ radicals are each independently selected from the group consisting of methoxy, phenyloxy, unsubstituted $C_1$-$C_4$-alkyl, preferably methyl, halogenated $C_1$-$C_4$-alkyl, preferably $CF_3$, $CHF_2$, $CH_2F$, $C_2F_5$, CN, halogen, preferably F, —C(O)O—$C_1$-$C_4$-alkyl, preferably —C(O)OMe, P(O)Ph$_2$, and substituted or unsubstituted heteroaryl having from 5 to 13 ring atoms, preferably carbazolyl.

In a further embodiment of the present invention, the indices r and q in the compounds of the formula III are each 0, i.e. all substitutable positions of the aryl groups bear hydrogen atoms. For all other radicals and indices, the aforementioned preferences apply.

The compounds of the formula III used in accordance with the invention may be used in different layers of the inventive organic light-emitting diode, suitable and preferred layer sequences in the inventive OLEDs having been specified above.

In one embodiment, the present invention relates to organic light-emitting diodes in which the compounds of the formula III are used as a matrix in the light-emitting layer E. In this case, the compounds of the formula (III) are used in the light-emitting layer in addition to components CA and CB. It is additionally possible to use the disilylcarbazoles or the disilylbenzophospholes of the formula (III) (X=NR$^{37}$ or PR$^{37}$) as a hole-conducting material CA in addition to component CB.

In a further embodiment, the present invention relates to an inventive organic light-emitting diode in which the compounds of the formula III are used in the blocking layer for electrons as an electron/exciton blocker and/or in the hole injection layer and/or in the hole conductor layer. It is likewise possible that the compounds of the formula III are additionally present in the light-emitting layer C and/or one or more of the aforementioned layers.

In a further embodiment, the present invention relates to an inventive organic light-emitting diode in which the compounds of the formula III are used in the blocking layer for notes as a hole/exciton blocker and/or in the electron injection layer and/or in the electron conductor layer. It is likewise possible that the compounds of the formula III are present in the light-emitting layer C and/or one or more of the aforementioned layers.

In a further embodiment, the present invention relates to an inventive organic light-emitting diode in which the compounds of the formula (III) are used in the blocking layer for holes as a hole/exciton blocker and/or in the electron injection layer and/or in the electron conductor layer. It is likewise possible that the compounds of the formula (III) are present in the light-emitting layer C and/or one or more of the aforementioned layers.

Depending on the layer in which the compounds of the formula III are used, the compounds of the formula III have different preferred $R^{37}$, $R^{38}$, $R^{39}$, $R^{40}$, $R^{41}$, $R^{42}$, $R^{43}$, $R^a$ and $R^b$ radicals and different X groups. In addition to the function of the layer in which the compounds of the formula III can be used in the inventive OLED, the $R^{37}$ to $R^{43}$, $R^a$ and $R^b$ radicals and the X group of the compounds of the formula III are additionally dependent on the electronic properties (relative positions of the HOMOs and LUMOs) of the particular layers used in the inventive OLED. It is thus possible, by virtue of suitable substitution of the compounds of the formula (II), to adjust the HOMO and LUMO orbital positions to the further layers used in the inventive OLED, and thus to achieve a high stability of the OLED and hence a long operative lifetime and good efficiencies.

The principles regarding the relative positions of HOMO and LUMO in the individual layers of an OLED are known to those skilled in the art. The principles, by way of example with regard to the properties of the blocking layer for electrons and of the blocking layer for holes, in relation to the light-emitting layer are detailed hereinafter:

The LUMO of the blocking layer for electrons is energetically higher than the LUMO of the materials used in the light-emitting layer (both of the emitter material and of any matrix materials used). The greater the energetic difference of the LUMOs of the blocking layer for electrons and of the materials in the light-emitting layer, the better are the electron- and/or exciton-blocking properties of the blocking layer for electrons. Suitable substitution patterns of the compounds of the formula III suitable as electron and/or exciton blocker materials thus depend upon factors including the electronic properties (especially the position of the LUMO) of the materials used in the light-emitting layer.

The HOMO of the blocking layer for electrons is energetically higher than the HOMOs of the materials present in the light-emitting layer (both of the emitter materials and of any matrix materials present). The greater the energetic difference of the HOMOs of the blocking layer for holes and of the materials in the light-emitting layer, the better are the hole- and/or exciton-blocking properties of the blocking layer for holes. Suitable substitution patterns of the compounds of the formula (II) suitable as hole and/or exciton blocker materials thus depend upon factors including the electronic properties (especially the position of the HOMO) of the materials present in the light-emitting layer.

Comparable considerations relating to the relative position of the HOMOs and LUMOs of the different layers used in the inventive OLED apply to the further layers which may be used in the OLED and are known to those skilled in the art.

Preferably suitable $R^{37}$, $R^{38}$, $R^{39}$, $R^{40}$, $R^{41}$, $R^{42}$, $R^{43}$, $R^a$ and $R^b$ radicals of the compounds of the formula III, depending on their use in different layers of the inventive OLEDs, are specified below. It is pointed out that substitutions of the compounds of the formula III other than those specified below may in principle be suitable for use in the different layers—depending on the electronic properties of the further layers of the OLED, especially depending on the electronic properties of the light-emitting layer.

Compounds of the General Formula III Which are Especially Suitable for Use in the Light-Emitting Layer C as Materials in Addition to Components CA and CB, and for Use in the Blocking Layer for Electrons, in the Hole Injection Layer and/or in the Hole Conductor Layer A preferred embodiment of the present invention relates to an organic light-emitting diode in which the compounds of the formula III are used in a blocking layer for electrons, in a hole injection layer and/or in a hole conductor layer and/or in the light-emitting layer C in addition to components CA and CB.

Preferred compounds of the formula III which can be used in at least one of the aforementioned layers have at least one $R^{37}, R^{38}, R^{39}, R^{40}, R^{41}, R^{42}$ or $R^{43}$ radical which is substituted or unsubstituted $C_1$-$C_{20}$-alkyl, heteroaryl having from 5 to 30 ring atoms, substituted or unsubstituted $C_6$-$C_{30}$-aryl, alkyl-substituted $C_6$-$C_{30}$-aryl (where "alkyl-substituted" means $C_1$-$C_{20}$-alkyl-substituted $C_6$-$C_{30}$-aryl), $C_6$-$C_{30}$-aryl substituted by at least one substituent with donor action, or $C_6$-$C_{30}$-aryl substituted by heteroaryl having from 5 to 30 ring atoms, or a substituent having donor action or, in the case of $R^{38}, R^{39}, R^{40}, R^{41}, R^{42}$ or $R^{43}$, hydrogen.

Suitable substituents with donor action (electron-donating radicals) are preferably selected from the group consisting of substituted and unsubstituted $C_1$-$C_6$-alkyl, preferably methyl, substituted and unsubstituted $C_6$-$C_{10}$-aryl, substituted and unsubstituted electron-rich heteroaryl having from five to 30 ring atoms, preferably selected from the group consisting of carbazolyl, pyrrolyl, imidazolyl, pyrazolyl, triazolyl, oxazolyl, thiophenyl, preferably carbazolyl, and thiophenyl, $C_1$-$C_{20}$-alkoxy, preferably $C_1$-$C_6$-alkoxy, more preferably methoxy and ethoxy, $C_6$-$C_{30}$-aryloxy, preferably $C_6$-$C_{10}$-aryloxy, more preferably phenyloxy, $C_1$-$C_{20}$-alkylthio, preferably $C_1$-$C_6$-alkylthio, more preferably —SCH$_3$, $C_6$-$C_{30}$-arylthio, preferably $C_6$-$C_{10}$-arylthio, more preferably —SPh, F, SiR$^{34}$R$^{35}$R$^{36}$ where R$^{34}$, R$^{35}$ and R$^{36}$ are preferably donor-substituted phenyl groups, amino (—NR$^{34}$R$^{35}$), preferably diphenylamino, phosphine (—PR$^{34}$R$^{35}$), hydrazine radicals, OH, donor-substituted vinyl groups, where R$^{34}$, R$^{35}$ and R$^{36}$ are each as defined above and are preferably donor-substituted phenyl groups.

Very particularly preferred substituents with donor action are selected from the group consisting of diphenylamino, carbazolyl, methoxy, phenoxy, very particular preference being given especially to methoxy and carbazolyl.

More preferably, the at least one radical which is used in the aforementioned layers is a $C_6$-aryl radical of the formula (d) substituted by at least one substituent with donor action and/or at least one heteroaryl radical having from 5 to 30 ring atoms

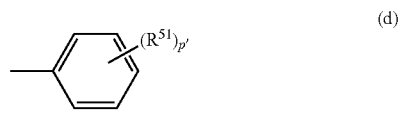

(d)

in which:
p' is 1, 2, 3, 4 or 5, preferably 1, 2 or 3, more preferably 1 or 2, and
$R^{51}$ is in each case independently substituted or unsubstituted $C_1$-$C_6$-alkyl, preferably methyl, substituted or unsubstituted $C_6$-$C_{10}$-aryl, $C_1$-$C_{20}$-alkoxy, preferably $C_1$-$C_6$-alkoxy, more preferably methoxy and ethoxy, $C_6$-$C_{30}$-aryloxy, preferably $C_6$-$C_{10}$-aryloxy, more preferably phenyloxy, $C_1$-$C_{20}$-alkylthio, preferably $C_1$-$C_6$-alkylthio, more preferably —SCH$_3$, $C_6$-$C_{30}$-arylthio, preferably $C_6$-$C_{10}$-arylthio, more preferably —SPh, SiR$^{34}$R$^{35}$R$^{36}$ where R$^{34}$, R$^{35}$ and R$^{36}$ are each as defined above and are preferably each donor-substituted phenyl groups, amino (—NR$^{34}$R$^{35}$), preferably diphenylamino, amido (—NR$^{34}$(C=O(R$^{35}$)), phosphine (—PR$^{34}$R$^{35}$), hydrazine radicals, OH, donor-substituted vinyl groups, where R$^{34}$, R$^{35}$ and R$^{36}$ are each as defined above and are preferably each donor-substituted phenyl groups,
or $R^{51}$ is substituted or unsubstituted electron-rich heteroaryl having from five to 30 ring atoms, preferably selected from the group consisting of carbazolyl, pyrrolyl, imidazolyl, pyrazolyl, triazolyl, oxazolyl, thiophenyl, more preferably carbazolyl and pyrrolyl.

Preferred R$^{51}$ groups are selected from the group consisting of methoxy, ethoxy, phenoxy, very particular preference being given especially to methoxy, and carbazolyl, pyrrolyl, imidazolyl, pyrazolyl, triazolyl, oxazolyl and thiophenyl, very particular preference being given to methoxy, phenyloxy, carbazolyl and NR$^{34}$R$^{31}$ where R$^{34}$ and R$^{35}$ are each phenyl or tolyl.

More preferably, the compounds of the formula (III) used in the aforementioned layers have at least one R$^{37}$, R$^{38}$, R$^{39}$, R$^{40}$, R$^{41}$, R$^{42}$ or R$^{43}$ radical selected from the group consisting of

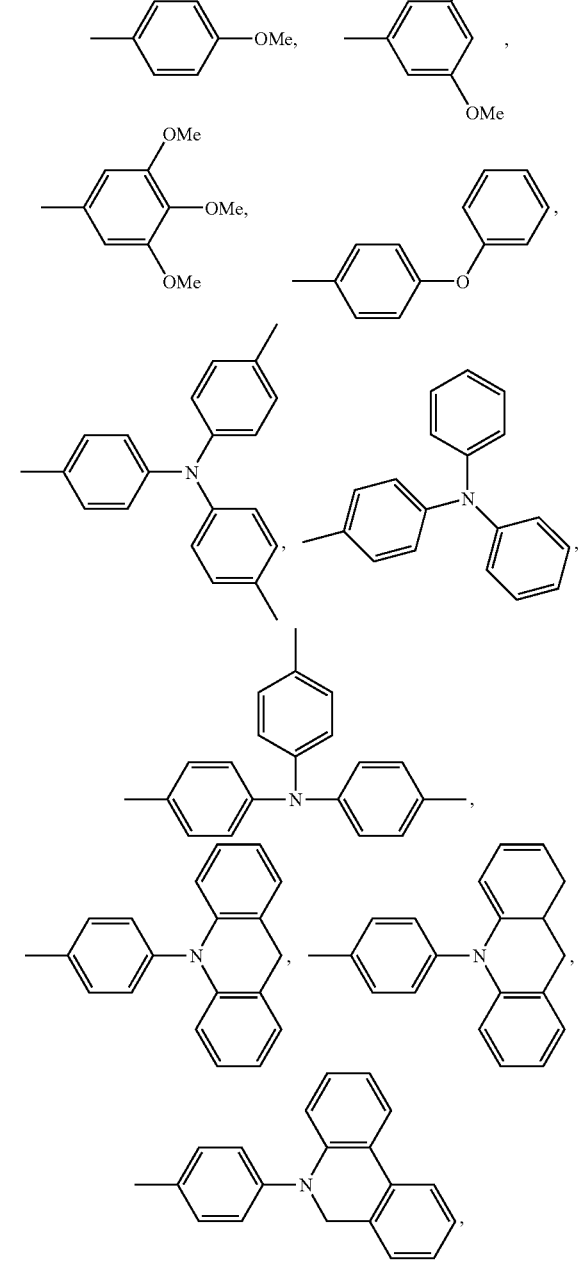

-continued

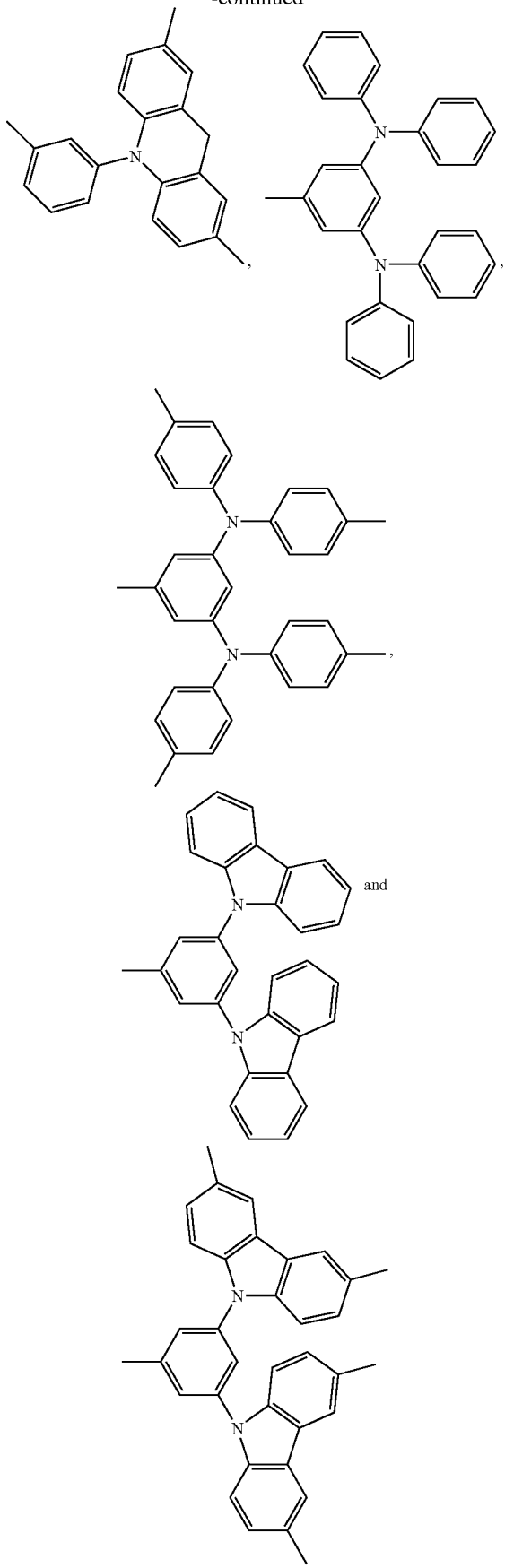

In a preferred embodiment, at least the $R^1$ radical is a $C_6$-aryl radical of the formula (d) substituted by at least one substituent with donor action and/or at least one heteroaryl radical having from 5 to 30 ring atoms;

and the $R^{38}$, $R^{39}$, $R^{40}$, $R^{41}$, $R^{42}$ and $R^{43}$ radicals are preferably each phenyl, methyl or methoxy- or phenyloxy-substituted phenyl.

Use of the Compounds of the Formula III in the Light-Emitting Layer C in Addition to Components CA and CB and/or in a Blocking Layer for Holes, an Electron Injection Layer and/or an Electron Conductor Layer The present invention further relates to an inventive organic light-emitting diode in which at least one compound of the formula III is present in at least one of the layers selected from light-emitting layer C in addition to components CA and CB, blocking layer for holes, electron injection layer and electron conductor layer.

Preferred compounds of the formula III used in the aforementioned layers have at least one $R^{37}$, $R^{38}$, $R^{39}$, $R^{40}$, $R^{41}$, $R^{42}$ or $R^{43}$ radical which is $C_1$- to $C_{20}$-alkyl substituted by at least one substituent with acceptor action (electron-withdrawing radical), $C_6$-$C_{30}$-aryl substituted by at least one substituent with acceptor action, $C_6$-$C_{30}$-aryl substituted by at least one heteroaryl radical having from 5 to 30 ring atoms, or a substituent with acceptor action.

Suitable substituents with acceptor action (electron-withdrawing radicals) are selected from the group consisting of electron-deficient heteroaryls having from 5 to 30 ring atoms, carbonyl (—CO($R^{34}$)), carbonylthio (—C=O(S$R^{34}$)), carbonyloxy (—C=O(O$R^{34}$)), oxycarbonyl (—OC=O($R^{34}$)), thiocarbonyl (—SC=O($R^{34}$)), OH, halogen, halogen-substituted $C_1$-$C_{20}$-alkyl, pseudohalogen radicals, amido (—C=O (N$R^{34}$), phosphonate (—P(O)(O$R^{34}$)$_2$), phosphate (—OP(O) (O$R^{34}$)$_2$), phosphine oxide (—P(O)$R^{34}R^{35}$), sulfonyl (—S (O)$_2R^{34}$), sulfonate (—S(O)$_2$O$R^{34}$), sulfate (—OS(O)$_2$ O$R^{34}$), sulfoxide (—S(O)$R^{34}$), sulfonamide (—S(O)$_2$ N$R^{34}R^{35}$), NO$_2$, boronic esters (—OB(O$R^{34}$)$_2$, imino (—C=N$R^{34}R^{35}$)), hydrazine radicals, hydrazole radicals, oxime radicals, nitroso groups, diazo groups, sulfoximines, Si$R^{34}R^{35}R^{36}$, borane radicals, stannane radicals, acceptor-substituted vinyl groups, boroxines and borazines, where $R^{34}$, $R^{35}$ and $R^{36}$ are each substituted or unsubstituted $C_1$-$C_{20}$-alkyl, preferably substituted or unsubstituted $C_1$-$C_6$-alkyl, or substituted or unsubstituted $C_6$-$C_{30}$-aryl, preferably substituted or unsubstituted $C_6$-$C_{10}$-aryl.

Preferred substituents with acceptor action are selected from the group consisting of halogen, preferably F, halogen-substituted alkyl, preferably CF$_3$, CH$_2$F, CHF$_2$, C$_2$F$_5$, C$_3$F$_3$H$_4$, pseudohalogen, preferably CN, carbonyloxy (—C=O(O$R^{14}$)), preferably —C=O(OCH$_3$), phosphine oxide, preferably P(O)Ph$_2$, and sulfonyl, preferably S(O)$_2$ Ph$_2$.

The at least one radical which is used in the aforementioned layers is more preferably a substituted $C_6$-aryl radical of the formula (e)

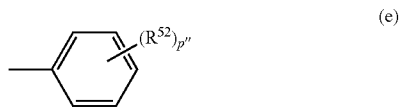 (e)

in which:

p" is 1, 2, 3, 4 or 5, preferably 1, 2 or 3, more preferably 1 or 2; and $R^{52}$ is carbonyl (—CO($R^{34}$)), carbonylthio (—C=O(S$R^{34}$)), carbonyloxy (—C=O(O$R^{34}$)), oxycarbonyl (—OC=O ($R^{34}$)), thiocarbonyl (—SC=O($R^{34}$)), OH, halogen, halogen-substituted $C_1$-$C_{20}$-alkyl, pseudohalogen radicals, amido (—C=O(N$R^{34}$)), phosphonate (—P(O)(O$R^{34}$)$_2$), phosphate (—OP(O)(O$R^{34}$)$_2$), phosphine oxide (—P(O)$R^{34}R^{35}$), sulfonyl (—S(O)$_2R^{34}$), sulfonate (—S(O)$_2$O$R^{34}$), sulfate (—OS(O)$_2$O$R^{34}$), sulfoxide (—S(O)$R^{34}$), sulfonamide (—S(O)$_2$N$R^{34}R^{35}$), NO$_2$, boronic esters (—OB(O$R^{34}$)$_2$, imino (—C=N$R^{34}R^{35}$)), hydrazine radicals, hydrazole radicals, oxime radicals, nitroso groups, diazo groups, sulfoximines, Si$R^{34}R^{35}R^{36}$, borane radicals, stannane radicals, acceptor-substituted vinyl groups, boroxines and borazines, where $R^{34}$, $R^{35}$ and $R^{36}$ are each substituted or unsubstituted $C_1$-$C_{20}$-alkyl, preferably substituted or unsubstituted $C_1$-$C_6$-alkyl, or substituted or unsubstituted $C_6$-$C_{30}$-aryl, preferably substituted or unsubstituted $C_6$-$C_{10}$-aryl; preferably halogen, preferably F, halogen-substituted alkyl, preferably CF$_3$, CH$_2$F, CHF$_2$, C$_2$F$_5$, C$_3$F$_3$H$_4$, pseudohalogen, preferably CN, carbonyloxy (—C=O(O$R^{34}$)), preferably —C=O(OCH$_3$), phosphine oxide, preferably P(O)Ph$_2$, and sulfonyl, preferably S(O)$_2$Ph$_2$;

or $R^{52}$ is substituted or unsubstituted electron-deficient heteroaryl having from five to 30 ring atoms, preferably selected from the group consisting of pyridine, pyrimidine and triazine.

More preferably, the compounds of the formula III used in the aforementioned layers have at least one $R^{37}$, $R^{38}$, $R^{39}$, $R^{40}$, $R^{41}$, $R^{42}$ or $R^{43}$ radical, selected from the group consisting of:

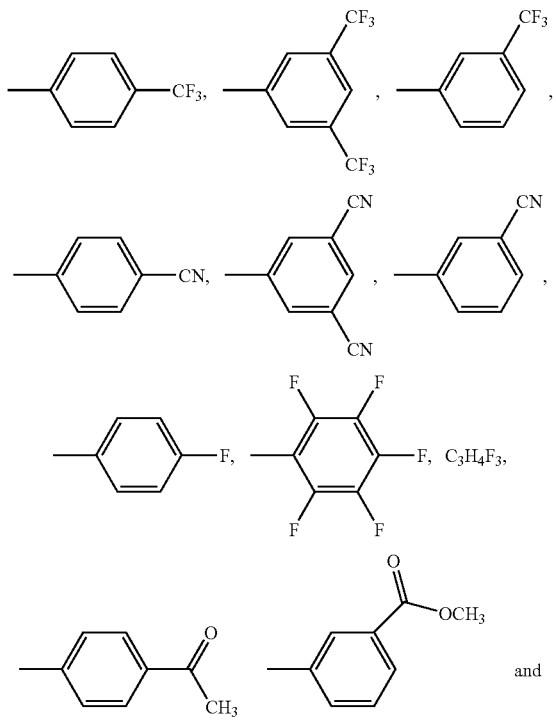

and

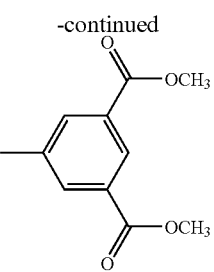

Preparation of the Compounds of the Formula III Used in Accordance with the Invention The compounds of the formula III can in principle be prepared by processes known to those skilled in the art; for example, carbazoles of the formula III (X=N$R^{37}$) can be prepared thermally or photochemically by oxidative ring closure from diphenylamine (or suitably substituted derivatives thereof) and, if appropriate, subsequent substitution, for example on the nitrogen. In addition, the carbazoles of the formula (II) can be obtained proceeding from the suitably substituted tetrahydrocarbazoles by oxidation. A typical carbazole synthesis is the Borsche-Drechsel cyclization (Borsche, Ann., 359, 49 (1908); Drechsel, J. prakt. Chem., [2], 38, 69, 1888). The aforementioned tetrahydrocarbazoles can be prepared by processes known to those skilled in the art, for example by condensation of, if appropriate, suitably substituted phenylhydrazine with, if appropriate, suitably substituted cyclohexanone to obtain the corresponding imine. In a subsequent step, an acid-catalyzed rearrangement and ring closure reaction is effected to obtain the corresponding tetrahydrocarbazole. It is likewise possible to carry out the preparation of the imine and the rearrangement and ring closure reaction in one step. The imine is—as mentioned above—oxidized to the desired carbazole.

The compounds of the formula III are prepared preferably proceeding from the corresponding base structure of the formula IV:

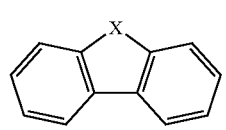

(IV)

where X is N$R^{37}$, SO, SO$_2$, S, O or P$R^{37}$ or NH or PH. Suitable base structures of the formula (III) are either commercially available (especially in the cases when X is SO, SO$_2$, S, O, NH or PH) or can be prepared by processes known to those skilled in the art.

In the case that X is NH or PH, the $R^{37}$ radicals may be introduced before or after the introduction of the $R^a$, $R^b$, Si$R^{38}R^{39}R^{40}$ and Si$R^{41}R^{42}R^{43}$ radicals, provided that the $R^a$ and $R^b$ radicals are present in the compounds of the formula III or precursor compounds suitable for introducing the $R^a$, $R^b$, Si$R^{38}R^{39}R^{40}$ and Si$R^{41}R^{42}R^{43}$ radicals. Thus, three variants—in the case that X=N$R^{37}$ and P$R^{37}$— are possible.

Variant a)

ia) preparing a precursor compound suitable for introducing the $R^a$, $R^b$, Si$R^{38}R^{39}R^{40}$ and Si$R^{41}R^{42}R^{43}$ radicals, iia) introducing the $R^{37}$ radical, iiia) introducing the $R^a$, $R^b$ radicals, where present, and the Si$R^{38}R^{39}R^{40}$ and Si$R^{41}R^{42}R^{43}$ radicals;

Variant b)

Variant b) is preferred especially when $R^{37}$ is substituted or unsubstituted $C_1$-$C_{20}$-alkyl or unsubstituted $C_6$-$C_{30}$-aryl or $C_1$-$C_{20}$-alkyl-substituted $C_6$-$C_{30}$-aryl.

ib) introducing the $R^{37}$ radical, iib) preparing a precursor compound suitable for introducing the $R^a$, $R^b$, $SiR^{38}R^{39}R^{40}$ and $SiR^{41}R^{42}R^{43}$ radicals, iiib) introducing the $R^a$, $R^b$ radicals, where present, and the $SiR^{38}R^{39}R^{40}$ and $SiR^{41}R^{42}R^{43}$ radicals.

Variant c)

ic) preparing a precursor compound suitable for introducing the $R^a$, $R^b$, $SiR^{38}R^{39}R^{40}$ and $SiR^{41}R^{42}R^{43}$ radicals, iic) introducing the $R^a$, $R^b$ radicals, where present, and the $SiR^{38}R^{39}R^{40}$ and $SiR^{41}R^{42}R^{43}$ radicals, iiic) introducing the $R^{37}$ radical.

In the case that X in formula (III) is $NR^{37}$, SO, $SO_2$, S, O or $PR^{37}$, the step of "introducing the $R^{37}$ radical" is dispensed with, such that the process comprises the following steps (variant d):

id) preparing a precursor compound suitable for introducing the $R^a$, $R^b$, $SiR^{38}R^{39}R^{40}$ and $SiR^{41}R^{42}R^{43}$ radicals, iid) introducing the $R^a$, $R^b$ radicals, where present, and the $SiR^{38}R^{39}R^{40}$ and $SiR^{41}R^{42}R^{43}$ radicals.

Step ia), iib), ic) and id)

Suitable precursor compounds for introducing the $R^a$, $R^b$, $SiR^{38}R^{39}R^{40}$ and $SiR^{41}R^{42}R^{43}$ radicals are especially the correspondingly halogenated, preferably brominated, compounds, and the corresponding base skeletons can be halogenated by methods known to those skilled in the art. Particular preference is given to brominating with $Br_2$ in glacial acetic acid or chloroform at low temperatures, e.g. 0° C. Suitable processes are, for example, when X=NPh, described in M. Park, J. R. Buck, C. J. Rizzo, *Tetrahedron*, 1998, 54, 12707-12714, and, when X=S, in W. Yang et al., *J. Mater. Chem.* 2003, 13, 1351. In addition, some brominated products are commercially available.

Step iia), ib) and iiic)

The $R^{37}$ radical is introduced by methods known to those skilled in the art.

The $R^{37}$ radical is preferably introduced by reacting a suitable halogenated or unhalogenated base skeleton in which X is NH or PH with an alkyl halide or aryl halide or heteroaryl halide of the formula $R^{37}$—Hal where $R^{37}$ has already been defined above and Hal is F, Cl, Br or I, preferably Br, I or F.

Preference is given to introducing the $R^{37}$ radical by reacting the suitable halogenated or unhalogenated base skeleton in which X is NH or PH with an alkyl fluoride, aryl fluoride or heteroaryl fluoride in the presence of NaH in DMF (nucleophilic substitution) or by reaction with an alkyl bromide or iodide, aryl bromide or iodide or heteroaryl bromide or iodide under Cu/base or Pd catalysis.

Step iiia), iiib), iic) and iid)

The desired silylated compounds of the formula III are prepared proceeding from the halogenated precursor compounds generally by halogen/metal exchange and subsequent silylation by methods known to those skilled in the art.

Further preferred compounds of the formula III and further details of suitable preparation processes for compounds of the formula III are specified in the application filed at the same time, which was unpublished at the priority date of the present application, with the title "Organic light-emitting diodes comprising carbene-transition metal complex emitters and at least one compound selected from disilylcarbazoles, disilyldibenzofurans, disilyldibenzothiophenes, disilyldibenzophospholes, disilyldibenzothiophene S-oxides and disilyldibenzothiophene S,S-dioxides".

In a preferred embodiment, the compounds of the formula III are used as exciton blockers in the hole- and/or electron-blocking layer and/or as a further material in the light-emitting layer C comprising components CA and CB. In the case when the compound of the formula III is a disilylcarbazole or disilyldibenzophosphole (X in formula III is $NR^1$ or $PR^1$), the compound of the formula III, in a further embodiment, can be used as component CA in addition to component CB in the light-emitting layer C.

The present invention therefore further provides an inventive organic light-emitting diode in which at least one compound of the formula III is present as a hole blocker material and/or exciton blocker material in the hole-blocking layer. Preferably, the hole-conducting material CA used in the organic light-emitting diode is at least one compound of the formula III in which X is $NR^1$ or $PR^1$.

The present invention therefore further provides an inventive organic light-emitting diode in which at least one compound of the formula III is present as a electron blocker material and/or exciton blocker material in the electron-blocking layer. Preferably, the hole-conducting material CA used in the organic light-emitting diode is at least one compound of the formula III in which X is $NR^1$ or $PR^1$.

Very particular preference is given to the use of the compounds of the formula III as hole and/or exciton blockers in the hole-blocking layer. Preferred compounds of the formula III suitable as hole blockers have already been specified above. These materials may be used simultaneously as exciton blockers in the hole-blocking layer. In a preferred embodiment, 9-(4-tert-butylphenyl)-3,6-bis(triphenylsilyl) carbazole (CzSi) and 9-(phenyl)-3,6-bis(triphenylsilyl)carbazole are used as hole blocker materials.

In general, the different layers of the inventive OLED have customary layer thicknesses known to those skilled in the art. Suitable layer thicknesses are, for example: anode A from 50 to 500 nm, preferably from 100 to 200 nm; hole-conducting layer B from 5 to 100 nm, preferably from 20 to 80 nm; light-emitting layer C from 1 to 100 nm, preferably from 10 to 80 nm; electron-conducting layer D from 5 to 100 nm, preferably from 20 to 80 nm; cathode E from 20 to 1000 nm, preferably from 30 to 500 nm. Any hole-blocking layer additionally present in the inventive OLED generally has a thickness of from 2 to 100 nm, preferably from 5 to 50 nm. It is possible that the electron-conducting layer and/or the hole-conducting layer have greater thicknesses than the layer thicknesses specified when they are electrically doped.

The inventive OLED can be produced by methods known to those skilled in the art. In general, the OLED is produced by successive vapor deposition of the individual layers onto a suitable substrate. Suitable substrates are, for example, glass, inorganic semiconductors or polymer films. For the vapor deposition, customary techniques can be used: thermal evaporation, chemical vapor deposition (CVD), physical vapor deposition (PVD) and others. In an alternative process, organic layers of the OLED can be applied from solutions or dispersions in suitable solvents, for which coating techniques known to those skilled in the art are used. The transition metal-carbene complexes of the general formula I which are used with preference in accordance with the invention in the hole-conducting layer B and in the light-emitting layer C are preferably applied by means of vapor deposition.

Mixtures Suitable for Use in OLEDs

As already mentioned above, it has been found in accordance with the invention, surprisingly, that it is possible to provide OLEDs with a surprisingly long lifetime when the light-emitting layer C is formed from a mixture of at least one hole-conducting material CA and at least one phosphorescence emitter CB. In general, the light-emitting layer C used in the inventive OLED comprises from 5 to 99% by weight, preferably from 20 to 97% by weight, more preferably from 50 to 95% by weight, most preferably from 70 to 95% by weight, of at least one hole-conducting material CA, and from 1 to 95% by weight, preferably from 3 to 80% by weight, more preferably from 5 to 60% by weight, most preferably from 5 to 30% by weight, of at least one phosphorescence emitter CB, where the total amount of the at least one hole-conducting material CA and the at least one phosphorescence emitter CB is 100% by weight. It has been found that even small amounts of the phosphorescence emitter are sufficient to obtain an inventive OLED with good efficiencies. In a very particularly preferred embodiment, the light-emitting layer C of the inventive OLED thus comprises from 5 to 20% by weight of at least one phosphorescence emitter CB and from 80 to 95% by weight of at least one hole-conducting material CA, where the total amount of the at least one hole-conducting material CA and of the at least one phosphorescence emitter CB is 100% by weight. It is possible in principle that the light-emitting layer C comprises further functional materials as well as components CA and CB. For example, the light-emitting layer C may additionally comprise at least one compound of the formula III, preferred compounds of the formula III having been specified above.

The present invention therefore further relates to mixtures comprising at least one carbene complex in combination with at least one hole-conducting material other than the first carbene complex or in combination with at least one phosphorescence emitter other than the first carbene complex.

The present invention further provides mixtures comprising at least two different carbene complexes CA and CB, the band gap of the carbene complex CA being greater than the band gap of the carbene complex CB. Carbene complex CB preferably has a band gap of ≧2.5 eV, more preferably from 2.5 eV to 3.4 eV, even more preferably from 2.6 eV to 3.2 eV and very especially preferably from 2.8 eV to 3.2 eV. In a very especially preferred embodiment, the carbene complex CB is a blue light-emitting carbene complex.

The carbene complexes CA and CB are preferably each carbene complexes of the general formula I, the carbene complexes CA and CB being different. Suitable and preferred carbene complexes of the formula I and suitable quantitative ratios of the carbene complexes CA and CB have already been mentioned above.

In a further embodiment, the present invention relates to mixtures comprising at least one carbene complex in combination with at least one hole-conducting material other than the first carbene complex or in combination with at least one phosphorescence emitter other than the first carbene complex, the mixtures comprising at least one carbene complex CB and at least one compound of the formula III according to claim 10, in which X is NR$^1$ or PR$^1$, as the hole-conducting material CA.

It has been found that, when mixtures comprising at least one hole-conducting material CA and at least one phosphorescence emitter CB are used as the light-emitting layer in OLEDs, a significant lengthening in the lifetime of the OLED can be achieved. The present invention therefore further provides for the use of mixtures comprising at least one hole-conducting material CA and at least one phosphorescence emitter CB as a light-emitting layer in OLEDs for prolonging the lifetime of the OLEDs. Preferred mixtures are mixtures as have been defined above, particular preference being given to using mixtures of two carbene complexes CA and CB, the band gap of the carbene complex CA used as the hole-conducting material being greater than the band gap of the carbene complex CB used as the phosphorescence emitter. Preferred carbene complexes and suitable amounts of the at least one hole-conducting material and of the at least one phosphorescence emitter in the light-emitting layer have already been mentioned above.

The examples which follow provide additional illustration of the invention.

EXAMPLES

Example

Production of an OLED

The ITO substrate used as the anode is cleaned first with commercial detergents for LCD production (Deconex® 20NS and neutralizing agent 25ORGAN-ACID®) and then in an acetone/isopropanol mixture in an ultrasound bath. To remove possible organic residues, the substrate is exposed to a continuous ozone flow in an ozone oven for a further 25 minutes. This treatment also improves the hole injection properties of the ITO.

Thereafter, the organic materials specified below are applied to the cleaned substrate by vapor deposition with a rate of approx. 0.5-5 nm/min at about 10$^{-7}$ mbar. The hole conductor and exciton blocker applied to the substrate is Ir(dpbic)$_3$ with a thickness of 30 nm.

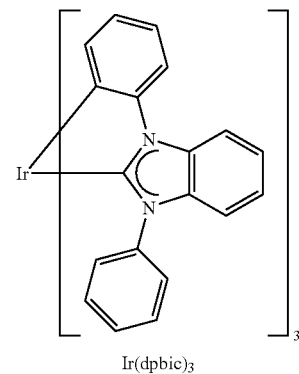

Ir(dpbic)$_3$ (For the preparation, see Ir complex (7) in the application WO 2005/019373.)

Subsequently, a mixture of 30% by weight of the compound Ir(cn-pmbic)$_3$

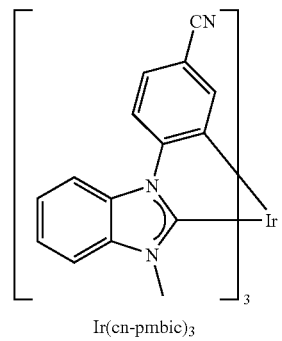

Ir(cn-pmbic)$_3$ and 70% by weight of the compound Ir(dpbic)$_3$ is applied by vapor deposition in a thickness of 20 nm, the former compound functioning as the emitter, the latter as the matrix material.

Subsequently, the material 9-(phenyl)-3,6-bis(triphenylsilyl)-9H-carbazole is applied as the exciton and hole blocker with a thickness of 5 nm by vapor deposition.

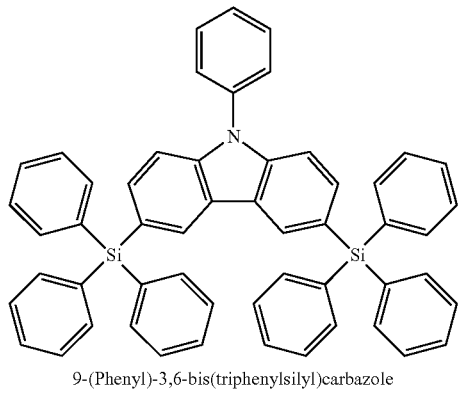

9-(Phenyl)-3,6-bis(triphenylsilyl)carbazole

Next, an electron transporter TPBI (1,3,5-tris(N-phenyl-2-benzylimidazolyl)benzene) in a thickness of 50 nm, a 0.75 nm-thick lithium fluoride layer and finally a 110 nm-thick Al electrode are applied by vapor deposition.

To characterize the OLED, electroluminescence spectra are recorded at various currents and voltages. In addition, the current-voltage characteristic is measured in combination with the light output emitted. The light output can be converted to photometric parameters by calibration with a photometer. To determine the lifetime, the OLED is operated at a constant current density of 3.2 mA/cm² and the decline in the light output is recorded. The lifetime is defined as that time which elapses as the luminance declines to half of the initial luminance.

For comparison, an OLED with an electron-conducting host material was produced. The structure was as follows: 30 nm of Ir(DPBIC)$_3$, a 20 nm-thick mixture of 30% Ir(CN-PMBIC)$_3$ and 70% of an electron-conducting host, TPBI in a thickness of 50 nm, a 0.75-thick lithium fluoride layer and finally 110 nm of aluminum.

The lifetime of the inventive OLED is improved by a factor of 50 compared to the comparative OLED.

The invention claimed is:

1. An organic light-emitting diode comprising
   i) an anode A;
   ii) a hole-conducting layer B formed from at least one hole-conducting material;
   iii) a light-emitting layer C;
   iv) an electron-conducting layer D; and
   v) a cathode E;
   where the layers A, B, C, D and E are arranged in the aforementioned sequence and one or more further layers may be arranged between layers A and B, B and C, C and D and/or D and E, wherein the light-emitting layer C comprises at least one hole-conducting material CA and at least one phosphorescence emitter CB,
   wherein a hole-blocking layer formed from at least one hole blocker material and/or exciton blocker material is present between the light-emitting layer C and the electron-conducting layer D in direct contact to the light-emitting layer C, wherein at least one compound of formula III is present in the hole-blocking layer as hole blocker material and/or excition blocker material,

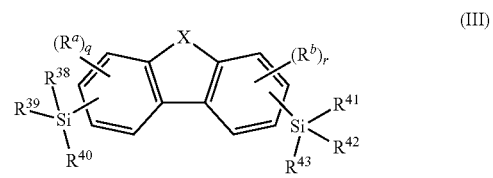

in which:
X is $NR^{37}$, S, O, $PR^{37}$, $SO_2$ or SO;
$R^{37}$ is substituted or unsubstituted $C_1$-$C_{20}$-alkyl, substituted or unsubstituted $C_6$-$C_{30}$-aryl, or substituted or unsubstituted heteroaryl having from 5 to 30 ring atoms;
$R^{38}$, $R^{39}$, $R^{40}$, $R^{41}$, $R^{42}$, $R^{43}$ are each independently substituted or unsubstituted $C_1$-$C_{20}$-alkyl, or substituted or unsubstituted $C_6$-$C_{30}$-aryl, or a structure of the general formula (c)

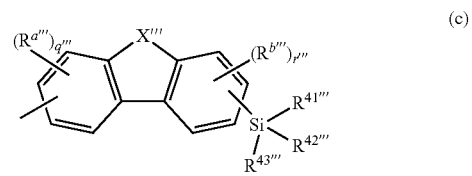

$R^a$, $R^b$ are each independently substituted or unsubstituted $C_1$-$C_{20}$-alkyl, substituted or unsubstituted $C_6$-$C_{30}$-aryl, or substituted or unsubstituted heteroaryl having from 5 to 30 ring atoms or a substituent with donor or acceptor action selected from the group consisting of: $C_1$-$C_{20}$-alkoxy, $C_6$-$C_{30}$ aryloxy, $C_1$-$C_{20}$-alkylthio, $C_6$-$C_{30}$-arylthio, $SiR^{34}R^{35}R^{36}$, halogen radicals, halogenated $C_1$-$C_{20}$-alkyl radicals, carbonyl (—CO($R^{34}$)), carbonylthio (—C=O($SR^{34}$)), carbonyloxy (—C=O($OR^{34}$)), oxycarbonyl (—OC=O($R^{34}$)), thiocarbonyl (—SC=O($R^{34}$)), amino (—$NR^{34}R^{35}$), OH, pseudohalogen radicals, amido (—C=O($NR^{34}$)), —$NR^{34}$C=O($R^{35}$), phosphonate (—P(O)($OR^{34}$)$_2$, phosphate (—OP(O)($OR^{34}$)$_2$), phosphine (—$PR^{34}R^{35}$), phosphine oxide (—P(O)$R^{34}_2$), sulfate (—OS(O)$_2$$OR^{34}$), sulfoxide (S(O)$R^{34}$), sulfonate (—S(O)$_2$$OR^{34}$), sulfonyl (—S(O)$_2$$R^{34}$), sulfonamide (—S(O)$_2$$NR^{34}R^{35}$), $NO_2$, boronic esters (—OB($OR^{34}$)$_2$), imino (—C=$NR^{34}R^{35}$)) borane radicals, stannane radicals, hydrazine radicals, hydrazone radicals, oxime radicals, nitroso groups, diazo groups, vinyl groups, sulfoximines, alanes, germanes, boroximes and borazines;
$R^{34}$ $R^{35}$, $R^{36}$ are each independently substituted or unsubstituted $C_1$-$C_{20}$-alkyl, or substituted or unsubstituted $C_6$-$C_{30}$-aryl; and
q,r are each independently 0, 1, 2 or 3; where, in the case when q or r is 0, all substitutable positions of the aryl radical are substituted by hydrogen,
where the radicals and indices in the group of the formula (c) X''', $R^{41'''}$, $R^{42'''}$, $R^{43'''}$, $R^{a'''}$, $R^{b'''}$, q''' and r''' are each independently as defined for the radicals and indices of the compounds of the general formula III X, $R^{41}$, $R^{42}$, $R^{43}$, $R^a$, $R^b$, q and r.

2. The organic light-emitting diode according to claim 1, wherein the HOMO of the at least one hole-conducting material of the hole-conducting layer B and the HOMO of the at least one hole-conducting material CA present in the light-emitting layer C have a separation from the work function of the anode A of ≦1 eV.

3. The organic light-emitting diode according to claim 1, wherein the band gap of the at least one hole-conducting material of the hole-conducting layer B and of the at least one hole-conducting material CA of the light-emitting layer C is greater than the band gap of the phosphorescence emitter CB.

4. The organic light-emitting diode according to claim 1, wherein the band gap of the phosphorescence emitter CB in the light-emitting layer is $\geq 2.5$ eV.

5. The organic light-emitting diode according to claim 1, wherein the at least one phosphorescence emitter CB comprises at least one element selected from groups IB, IIB, IIIB, IVB, VB, VIIB, VIIB, VIII, the lanthanides and IIIA of the Periodic Table of the Elements (CAS version).

6. The organic light-emitting diode according to claim 1, wherein the at least one phosphorescence emitter is a transition metal-carbene complex of the general formula I

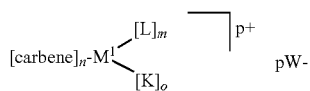

(I)

in which the symbols are each defined as follows:
$M^1$ is a metal atom selected from the group consisting of transition metals of groups IB, IIB, IIIB, IVB, VB, VIIB, VIIB, VIII, the lanthanides and IIIA of the Periodic Table of the Elements (CAS version) in any oxidation state possible for the particular metal;
carbene is a carbene ligand which may be uncharged or monoanionic and mono-, bi- or tridentate; the carbene ligand may also be a bis- or triscarbene ligand;
L is a mono- or dianionic ligand, which may be mono- or bidentate;
K is an uncharged mono- or bidentate ligand;
n is the number of carbene ligands, where n is at least 1, and the carbene ligands in the complex of the formula I when n>1 may be the same or different;
m is the number of ligands L, where m may be 0 or $\geq 1$, and the ligands L when m>1 may be the same or different;
o is the number of ligands K, where o may be 0 or $\geq 1$, and the ligands K when o>1 may be the same or different;
p is the charge of the complex: 0, 1, 2, 3 or 4; and
W– is a monoanionic counterion;
where the sum of n+m+o and p depends on the oxidation state and coordination number of the metal atom used, the charge of the complex and on the denticity of the carbene, L and K ligands, and on the charge of the carbene and L ligands, with the condition that n is at least 1.

7. The organic light-emitting diode according to claim 1, wherein the at least one hole-conducting material of the hole-conducting layer B and/or the at least one hole-conducting material CA of the light-emitting layer C comprise a carbene complex, where the carbene complexes of the hole-conducting materials in layers B and C may be the same or different, and the band gap of the carbene complexes used as the hole-conducting material is greater than the band gap of the at least one phosphorescence emitter CB.

8. The organic light-emitting diode according to claim 1, wherein an electron-blocking layer formed from at least one electron blocker material and/or exciton blocker material is present between the hole-conducting layer B and the light-emitting layer C.

* * * * *